(12) United States Patent
Lin et al.

(10) Patent No.: US 11,683,936 B2
(45) Date of Patent: Jun. 20, 2023

(54) SEMICONDUCTOR MEMORY STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Meng-Han Lin, Hsinchu (TW); Chia-En Huang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 74 days.

(21) Appl. No.: 17/141,915

(22) Filed: Jan. 5, 2021

(65) Prior Publication Data
US 2022/0216235 A1 Jul. 7, 2022

(51) Int. Cl.
| | | |
|---|---|---|
| H01L 27/11597 | (2017.01) | |
| H01L 27/11587 | (2017.01) | |
| H10B 51/20 | (2023.01) | |
| H10B 51/10 | (2023.01) | |

(52) U.S. Cl.
CPC .. *H01L 27/11597* (2013.01); *H01L 27/11587* (2013.01)

(58) Field of Classification Search
CPC .................. H01L 27/11587; H01L 27/11597
See application file for complete search history.

(56) References Cited

U.S. PATENT DOCUMENTS

2021/0175253 A1* 6/2021 Han .................. H01L 29/78642

* cited by examiner

*Primary Examiner* — Meiya Li
(74) *Attorney, Agent, or Firm* — WPAT Law; Anthony King

(57) ABSTRACT

A semiconductor memory structure and method of manufacturing a semiconductor memory structure are provided. The semiconductor memory structure includes alternatively arranged stacking portions and cell regions. Each cell region includes two ferroelectric layers formed along the adjacent stacking portions; and at least one central portion disposed between the ferroelectric layers and including a first conductive structure and a second conductive structure separated by a channel isolation structure as well as two semiconductor layers formed along the ferroelectric layers. The first conductive structure includes a contact portion and an extension portion. The contact portion is disposed between the semiconductor layers. The extension portion extends from the contact portion to the channel isolation structure and is separated from the semiconductor layers through dielectric layers.

20 Claims, 29 Drawing Sheets

SEMICONDUCTOR MEMORY STRUCTURE AND METHOD OF MANUFACTURING THE SAME

BACKGROUND

Many modern-day electronic devices include non-volatile memory. Non-volatile memory is electronic memory that is able to store data in the absence of power. A promising candidate for the next generation of non-volatile memory is ferroelectric random-access memory (FeRAM). FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
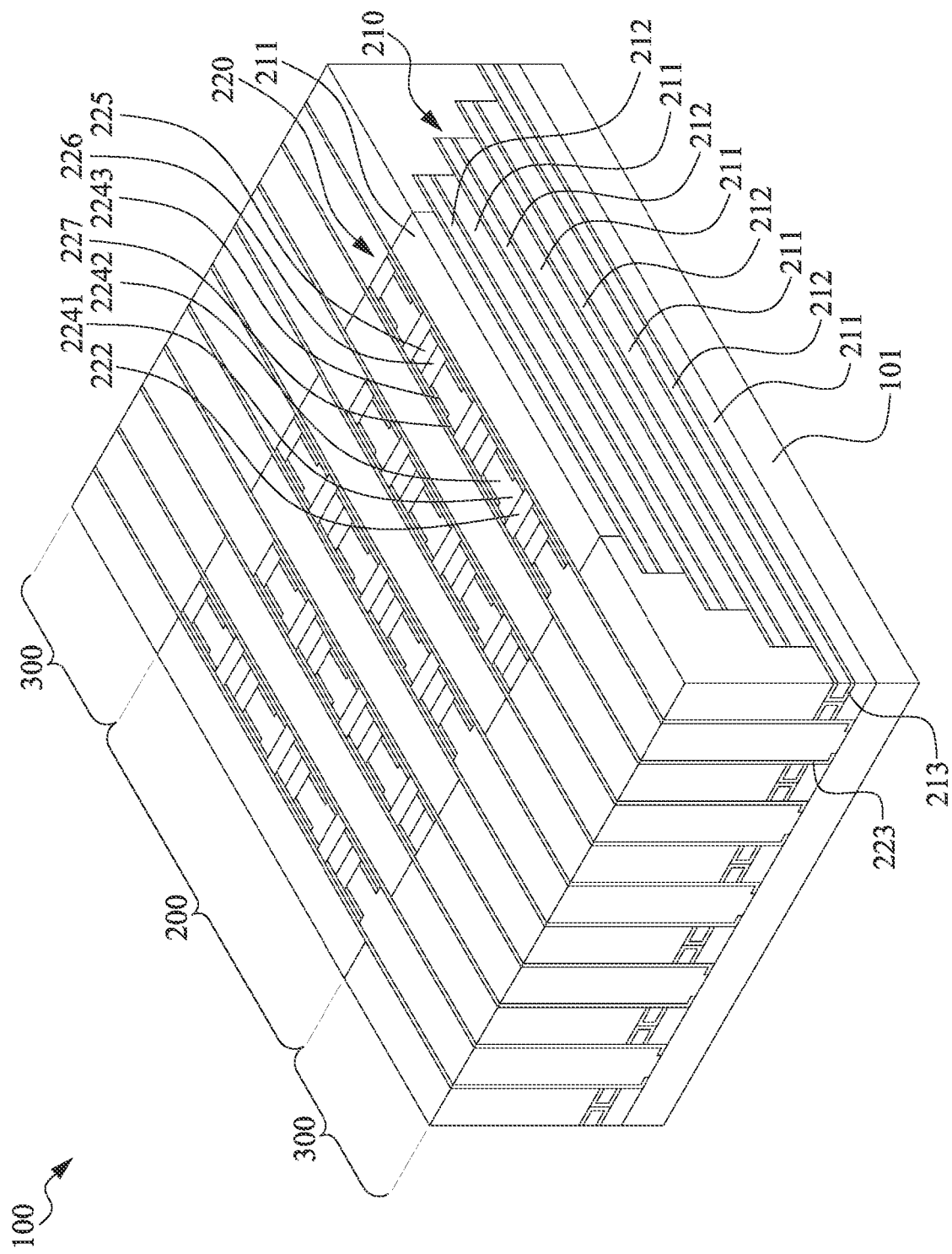
FIG. 1 is a schematic perspective view illustrating a semiconductor memory structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Many modern day electronic devices contain electronic memory configured to store data. Electronic memoiy may be volatile memory or non-volatile memory. Volatile memory stores data when power is on, while non-volatile memoiy (NVM) is able to store data when power is off. For example, ferroelectric random-access memory (FeRAM) devices are one promising candidate for a next generation NVM technology. This is because FeRAM devices provide many advantages, including fast write time, high endurance, low power consumption, and low susceptibility to damage from radiation. NVM technology uses memory cells that are located. within a back-end-of-the-line (BEOL) of an integrated chip (e.g., located between metal interconnect layers overlying a semiconductor substrate). The memory cells are stacked into multiple layers to create a three-dimensional (3D) structure.

For the FeRAM, an electric field is required to switch the polarization between positive and negative voltages to store information. In some embodiments, a source line (SL) and a bit line (BL) are formed on a channel stack in one memory cell. The channel stack comprises a word line (WL), a ferroelectric layer and a channel layer and the SL and BL are formed on the channel layer. To retain low resistance, the contact area (so called "channel lens") between the SL and the channel layer as well as the contact area between the BL and the channel layer are small, so the SL and BL are usually formed on the channel layer symmetrically and separated from each other with a considerable distance. The polarization may not be switched unless a sufficiently large field (voltage) is applied at the word line. For example, a negative polarization (due to most negative voltage drop in the channel layer) may not be switched back to a positive polarization.

The present disclosure relates to a design of 3D non-volatile memory structures for enhancing the switching performance and read speed. In some embodiments, the provided structure can be applied to FeRAM and extendable to other memories such as flash, resistive random access memory (RRAM), magnetic random access memory (MRAM) with decent process and structure modifications. Accordingly, a stable type of 3D stackable nonvolatile memory devices can be formed, so that the device property can be enhanced.

Figure 2:
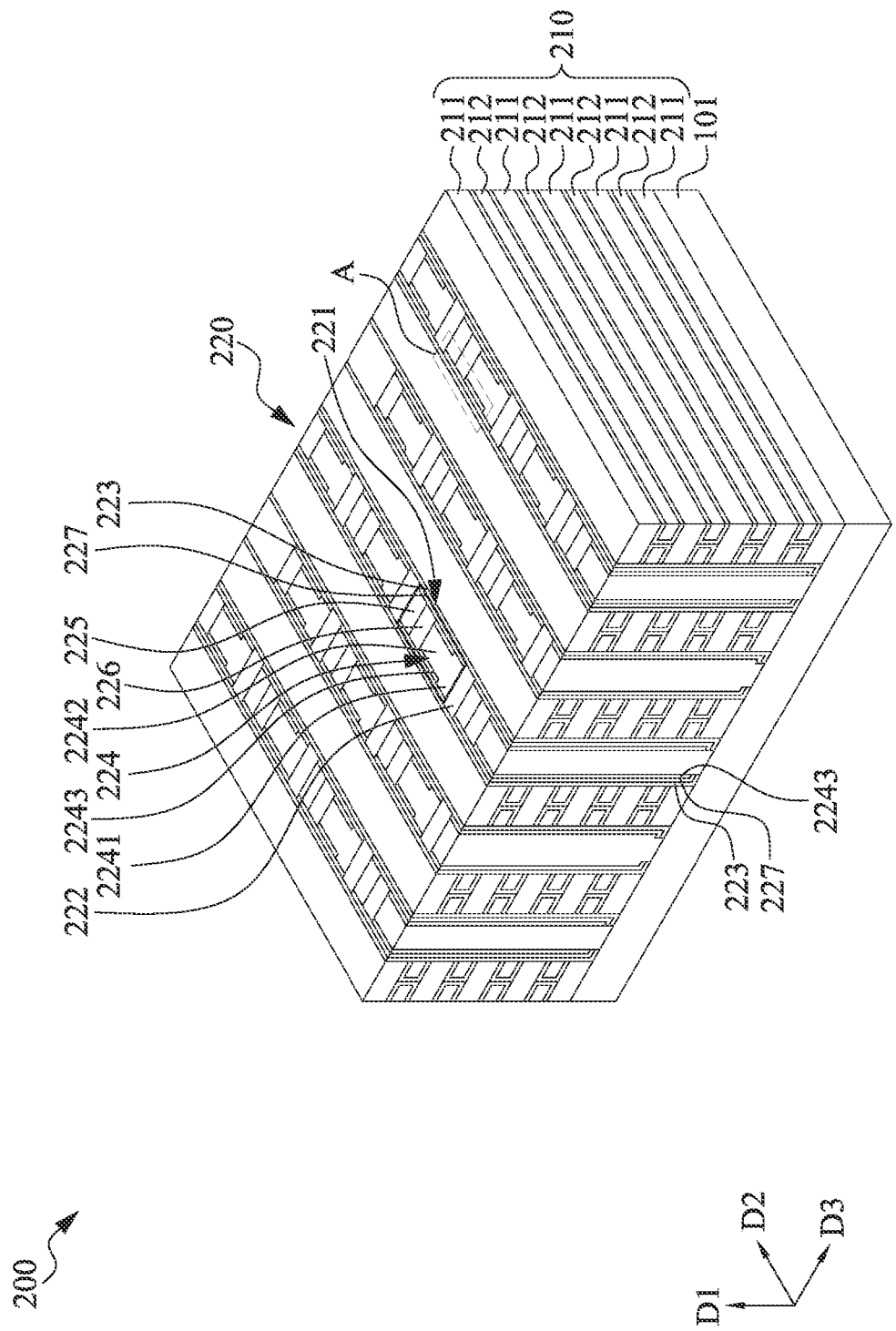
FIG. 2 is a schematic perspective view illustrating a cell array region of the semiconductor memory structure of FIG. 1, according to the present disclosure.
Figure 3:
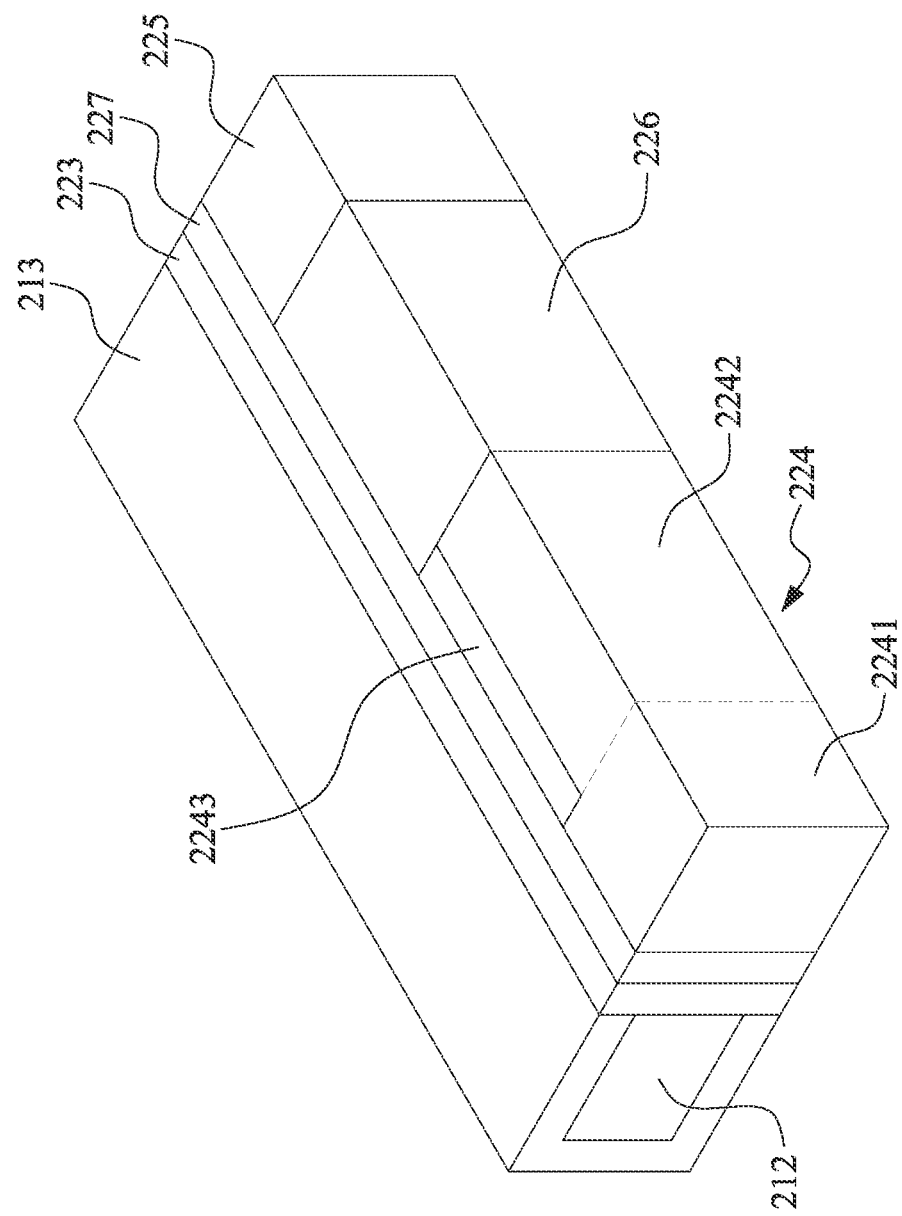
FIG. 3 is a schematic perspective view illustrating the unit cell A in the cell array region of FIG. 2 according to the present disclosure.
Figure 4:
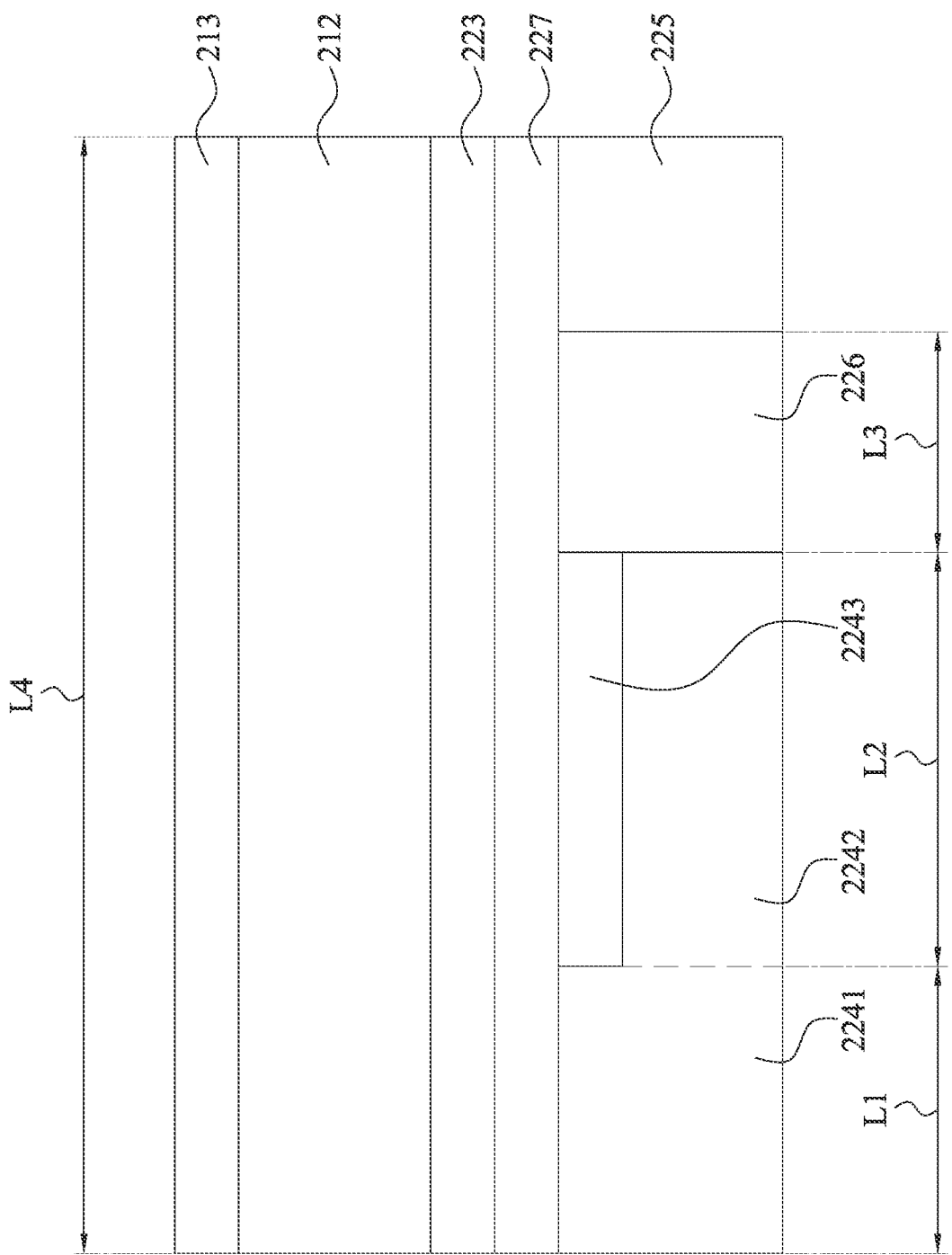
FIG. 4 is a cross-sectional top view of the unit cell A in the cell array region of FIG. 2 according to the present disclosure.

FIG. 1 is a schematic drawing illustrating a semiconductor memory structure 100 in accordance with one or more embodiments of the present disclosure. To take a closer look, FIG. 2 shows a perspective view illustrating a cell array region of the semiconductor memory structure of FIG. 1; and FIGS. 3 and 4 show perspective and top views illustrating a unit cell A depicted in FIG. 2.

In some embodiments, as shown in FIG. 1, the semiconductor memory structure 100 includes a cell array region 200 sandwiched by two connection regions 300. With further reference to FIG. 2, the cell array region 200 includes a plurality of stacking portions 210 and a plurality of cell regions 220. In some embodiments, the substrate 101 is a silicon substrate. Alternatively or additionally, the substrate 101 includes germanium, an alloy semiconductor (for example. SiGe), another suitable semiconductor material, or a combination thereof. Alternatively, the substrate 101 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some embodiments, the substrate 101 can include various devices, such as CMOS devices. For example, the substrate 101 can include CMOS devices under array (CUA), but the disclosure is not limited thereto.

In some embodiments, the stacking portion 210 can be formed on the substrate 101 and includes a plurality of insulating layers 211 and a plurality of first conductive layers 212 stacking along a first direction D1. Further, the insulating layers 211 and the first conductive layers 212 are alternately arranged and are configured in a staircase structure (as shown in FIG. 1). The number of the alternating layers included in the stacking portion 210 can be as great as the number of layers needed for the semiconductor memory structure. Further, in some embodiments, the topmost layer and the bottommost layer can both be the insulating layers 211, as shown in FIG. 1, but the disclosure is not limited thereto. Thicknesses of the insulating layers 211 and thicknesses of the first conductive layers 212 can be similar or different, depending on different product requirements. In some embodiments, the insulating layers 211 include an insulating material, such as silicon oxide, but the disclosure is not limited thereto. In some embodiments, the first conductive layer 212 may include metals, but the disclosure is not limited thereto. In some embodiments, the first conductive layers 212 correspond to word lines (WL).

In some embodiments, each first conductive layer 212 may be divided to two sublayers by glue layers 213. Each glue layer 213 partially surrounds one sublayer so as to not only separate two adjacent sublayers from each other, but also separate the first conductive layer 212 from the adjacent insulating layers 211. Each glue layer 213 may have a U shape, V shape, W shape and so on, but the disclosure is not limited thereto. In some embodiments, the glue layer 213 may include oxides, such as $Al_2O_3$. The glue layer 213 can be used to improve adhesion of the metal portion in the stacking portion 210.

Each cell region 220 in the cell array region 200 can be formed over the substrate 101 and extend along a second direction D2 and can be sandwiched by the stacking portions 210, so that the cell regions 220 and the stacking portions 210 are alternately arranged along a third direction D3. In some embodiments, each cell region 220 comprises a plurality of unit cells A. In some embodiments, each cell region 220 comprises at least one central portion 221 extending through the cell array region 200 along the first direction D1, cell isolation structures 222 separating two or more central portions 221 from each other, and at least one ferroelectric layer 223 formed along sidewalls of the cell region 220 and besides the stacking portion 210.

In some embodiments, the central portion 221 comprises a first conductive structure 224, a second conductive structure 225, a channel isolation structure 226 separating the first conductive structure 224 from the second conductive structure 225, and two semiconductor layers 227 formed along the ferroelectric layers 223, so that the first conductive structure 224, the second conductive structure 225 and the channel isolation structure 226 are separated from the ferroelectric layers 223 through the semiconductor layer 227.

In some embodiments, the first conductive structure 224 and the second conductive structure 225 independently penetrate through the cell array region 200 along the first direction D1 to contact the substrate 101. The first conductive structure 224 and the second conductive structure 225 are formed in a column shape, e.g., flat column or rectangular column shape, extending in the cell array region 200 along the first direction D1. In some embodiments, the first conductive structure 224 corresponds to source lines and the second conductive structure 225 corresponds to bit lines. In some embodiments, the first conductive structure 224 corresponds to bit lines and the second conductive structure 225 corresponds to source lines. In some embodiments, the bit lines and the source lines can independently include various conductive materials, e.g., metal such as aluminum (Al), titanium (Ti), cobalt (Co), silver (Ag), gold (Au), copper (Cu), nickel (Ni), chromium (Cr), hafnium (Hf), rhodium (Ru), tungsten (W), platinum (Pt) and/or alloys thereof, or a metal nitride such as titanium nitride (TiN), tantalum nitride (TaN), or the like, but the disclosure is not limited thereto.

In some embodiments, the first conductive structures 224 correspond to source lines and the second conductive structures 225 correspond to bit lines, The first conductive structure 224 presents a T-shape from the top view and comprises a contact portion 2241 and an extension portion 2242 as shown in FIGS. 3 and 4, which show perspective and top views of the unit cell A depicted in FIG. 2. In some embodiments, the contact portion 2241 of the first conductive structure 224 formed between the semiconductor layers 227 and has a contact area contacting the semiconductor layer 227, which is substantially identical to the contact area of the second conductive structure 225 contacting the semiconductor layer 227. The extension portion 2242 extends from the contact portion 2241 to the channel isolation structure 226 and can be separated from the semiconductor layers 227 through a dielectric layer 2243. In some embodiments, the dielectric layer 2243 may have a thickness from about 0.1 nm to about 50 nm, In some embodiments, the dielectric layer 2243 may have a thickness from about 1 nm to about 30 nm. In some embodiments, the dielectric layer 2243 may have a thickness from about 5 nm to about 20 nm, In some embodiments, the dielectric layer 2243 may include, but not limited to, silicon oxide or silicon dioxide ($SiO_2$), silicon oxynitride (SiON), silicon nitride (SiN), silicon carbide, carbon-containing silicon oxide, silicon oxycarbide ($SiO_xC_y$), a high-k dielectric material, other suitable dielectric material, or combinations thereof. Exemplary high-k dielectric materials include hafnium oxide ($HfO_2$), aluminum oxide ($Al_2O_3$), zirconium oxide ($ZrO_2$), gallium oxide (Ga$_2$O$_3$), titanium oxide (TiO$_2$), lanthanum oxide (La$_2$O$_3$), tantalum oxide (Ta$_2$O$_5$), gadolinium oxide (Gd$_2$O$_3$), yttrium oxide (Y$_2$O$_3$), hafnium dioxide-alumina (HfO$_2$—Al$_2$O$_3$) alloy, hafnium aluminum oxide (HfAlO), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), titanium aluminum oxide (TiAlO), lanthanum aluminum oxide (such as LaAlO$_3$), other high-k dielectric material, or combinations thereof.

From the top view of the first conductive structure 224 as shown in FIG. 4, the contact portion 2241 has a length L1 from the cell isolation structures 222 to the extension portion 2242 and the extension portion 2242 has a length L2 from the contact portion 2241 to the channel isolation structure 226. In some embodiments, L1 may be longer than L2. In some embodiments, L2 may be longer than L1. In some embodiments, L1 may be similar or substantially equal to L2. In some embodiments, the semiconductor layer 227 has a length L4 in the central portion 221 and the length L2 of the extension portion 2242 may range from about 10% to about 90% with respect to the length L4 of the semiconductor layer 227. In some embodiments, the length L2 of the extension portion 2242 may range from about 20% to about 80% with respect to the length L4 of the semiconductor layer 227. In some embodiments, the length L2 of the extension portion 2242 may range from about 30% to about 70% with respect to the length L4 of the semiconductor layer 227.

An asymmetric structure can be obtained by the extension of first conductive structure 224 (i.e. the source line). In some embodiments, a contact area between the first conductive structure 224 and the semiconductor layer 227 is similar to a contact area between the second conductive structure and the semiconductor layer 227; therefore the asymmetric first conductive structure 224 renders less impact to electrical resistances of the source line and the bit line and the read speed. Further, the extension portion 2242 helps to enhance electric field, and thus, switching speed can be accelerated.

The channel isolation structure 226 may be disposed between the semiconductor layers 227 and electrically isolates the first conductive structure 224 and the second conductive structure 225. From the top view as shown in FIG. 4, the channel isolation structure 226 has a length L3. In some embodiments, L3 may be longer than, equal to or less than the length L2 of the extension portion 2242. In some embodiments, L3 is equal to or less than the length L2 of the extension portion 2242. In some embodiments, L3 is longer than, equal to or less than the length L1 of the contact portion 2241. In some embodiments, L3 may range from about 1 nm to about 100 nm. In some embodiments, L3 may range from about 3 nm to about 75 nm. In some embodiments, L3 may range from about 5 nm to about 50 nm.

In some embodiments, the semiconductor layers 227 may include a semiconductor material. In some embodiments, the semiconductor layers 227 may include various materials, such as an amorphous silicon (a-Si) material, a polycrystalline silicon (poly-Si) material, an oxide semiconductor material (e.g., indium zinc oxide (IZO), indium-gallium-zinc oxide (IGZO), indium tungsten oxide (IWO), indium tin oxide (ITO), zinc oxide (ZnO), stannous oxide (SnO), and copper oxide (CuO)), or the like, but the disclosure is not limited to the above-mentioned materials. In some embodiments, the semiconductor layers 227 may serve as channel. From the cross-sectional side view as shown in FIG. 2, the semiconductor layer 227 has an L-shaped vertical cross section and comprises a longitudinal portion and a horizontal bottom. In some embodiments, the dielectric layers 2243 may be formed along the longitudinal portion of the semiconductor layers 227 and formed on the horizontal bottom, so the dielectric layer 2243 may be substantially aligned with the end of the horizontal bottom of the semiconductor layers 227 as shown in FIG. 2.

The cell isolation structures 222 separate the central portions 221 from each other when there are two or more central portions 221 in one cell region 220. In some embodiments, the cell isolation structures 222 are arranged in an array configuration or a staggered array configuration. In some embodiments, the cell isolation structures 222 penetrate through the cell array region 200 and contact the substrate 101. In some embodiments, the cell isolation structures 222 may include dielectric materials, including oxides, nitrides and the like, such as silicon oxide, silicon nitride, SiCN, Al$_2$O$_3$, HfO$_2$, SiON, and La$_2$O$_3$, but the disclosure is not limited to the above-mentioned materials.

The ferroelectric layer 223 can be formed besides the stacking portion 210 and thus can be sandwiched by the stacking portion 210 and the central portion 221 and also sandwiched by the stacking portion 210 and the cell isolation structures 222. In some embodiments, the ferroelectric layer 223 penetrates through the cell array region 200 along the first direction D1 and is in contact with the substrate 101. As mentioned above, the first conductive layers 212 may correspond to word lines. In some embodiments, the ferroelectric layers 223 are disposed between the first conductive layer 212 (i.e. word line) and the first conductive structure 224 (i.e. source line) or between the first conductive layer 212 (i.e. word line) and the second conductive structure 225 (i.e. bit line). In some embodiments, the first conductive layers 212 (i.e. word lines) can control the adjacent unit cell A in the same level as shown in FIGS. 3 and 4. From the cross-sectional side view as shown in FIG. 2, the ferroelectric layer 223 has an L-shaped vertical cross section; correspondingly, the semiconductor layer 227 formed along the ferroelectric layer 223 also has an L-shaped vertical cross section. In some embodiments, the ferroelectric layer 223 comprises a longitudinal portion and a horizontal bottom to form the L-shaped vertical cross section. In some embodiments, the longitudinal portion of the semiconductor layers 227 may be formed along the longitudinal portion of the ferroelectric layer 223 and the horizontal portion of the semiconductor layers 227 may be formed on the horizontal portion of the ferroelectric layer 223, so an end of the horizontal portion of the semiconductor layers 227 may be substantially aligned with the end of the horizontal portion of the ferroelectric layer 223 as shown in FIG. 2. The first conductive structure 224 and the second conductive structure 225 can contact the substrate 101 through a gap between the horizontal portions of two ferroelectric layers 223 beside the first and second conductive structures 224 and 225.

Figure 5:
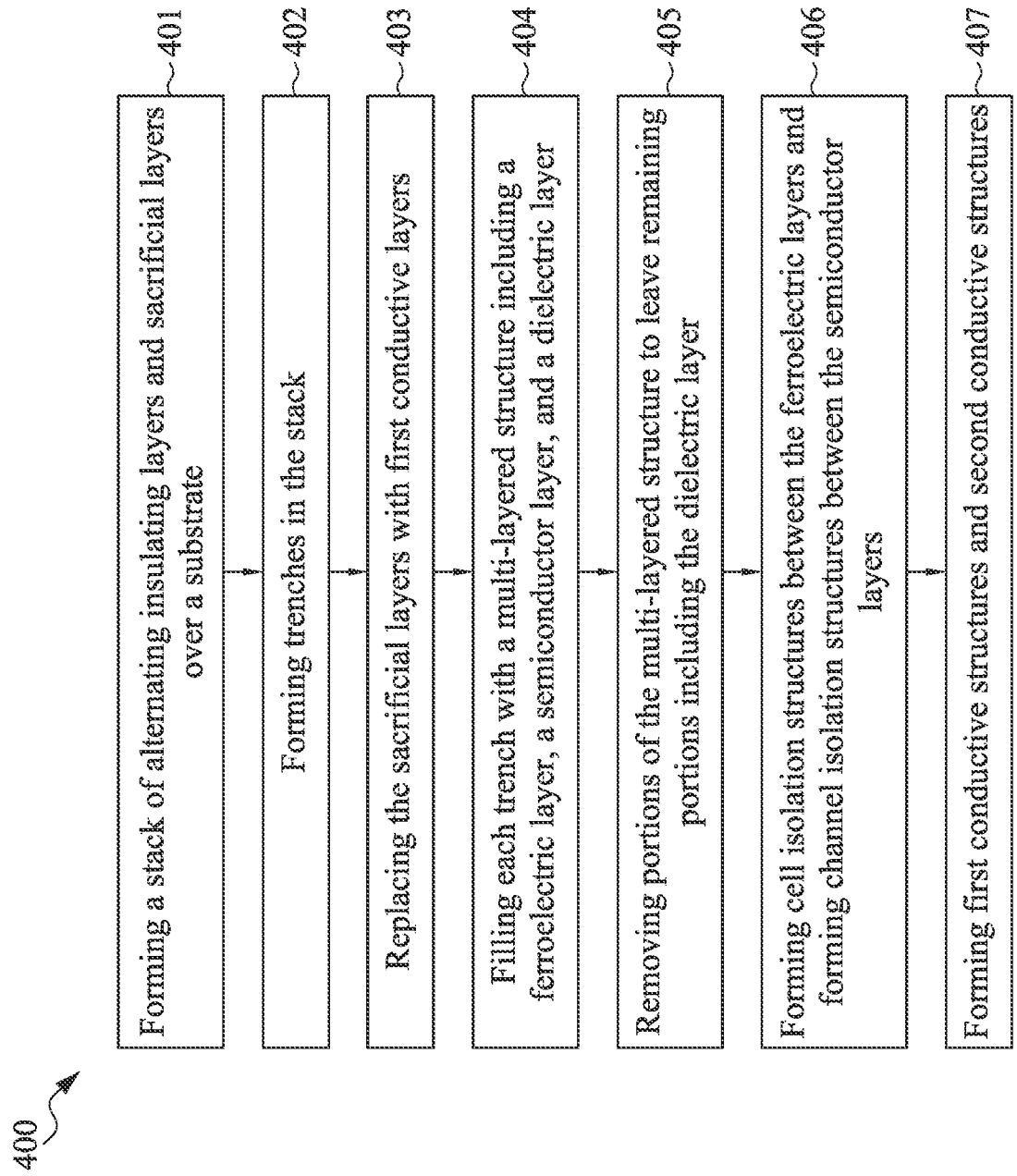
FIG. 5 is a flow diagram of a method of manufacturing a semiconductor memory structure in accordance with some embodiments of the present disclosure.

FIG. 5 is a flowchart representing a method 400 for forming a semiconductor memory structure according to various aspects of the present disclosure. In some embodiments, the semiconductor memory structure 100 can be formed by the method 400, but the disclosure is not limited thereto. The method 400 includes a number of operations (401, 402, 403, 404, 405, 406 and 407) and the description and illustration are not deemed as a limitation as the sequence of the operations and the structure of the semiconductor memory structure. In FIGS. 6 to 24, the reference numerals will be given like those which have already been described above so as to omit the repetition of similar descriptions. In addition, portions about which no particular description will be made have the similar constructions to those of the semiconductor memory structure 100 described above and provide the same advantages provided thereby. It should be noted that the operations of the method 400 may be rearranged or otherwise modified within the scope of the various aspects. It should further be noted that additional processes may be provided before, during, and after the method 400, and that some other processes may be only briefly described herein.

With reference to FIG. 5, method 400 of forming a stack of alternating insulating layers and sacrificial layers over a substrate 401; forming trenches in the stack 402; replacing the sacrificial layers with first conductive layers 403; filling each trench with a multi-layered structure including a ferroelectric layer, a semiconductor layer, and a dielectric layer 404; removing portions of the multi-layered structure to leave remaining portions including the dielectric layer 405; forming cell isolation structures between the ferroelectric layers and forming channel isolation structures between the semiconductor layers 406; and forming first conductive structures and second conductive structures 407.

Figure 6:
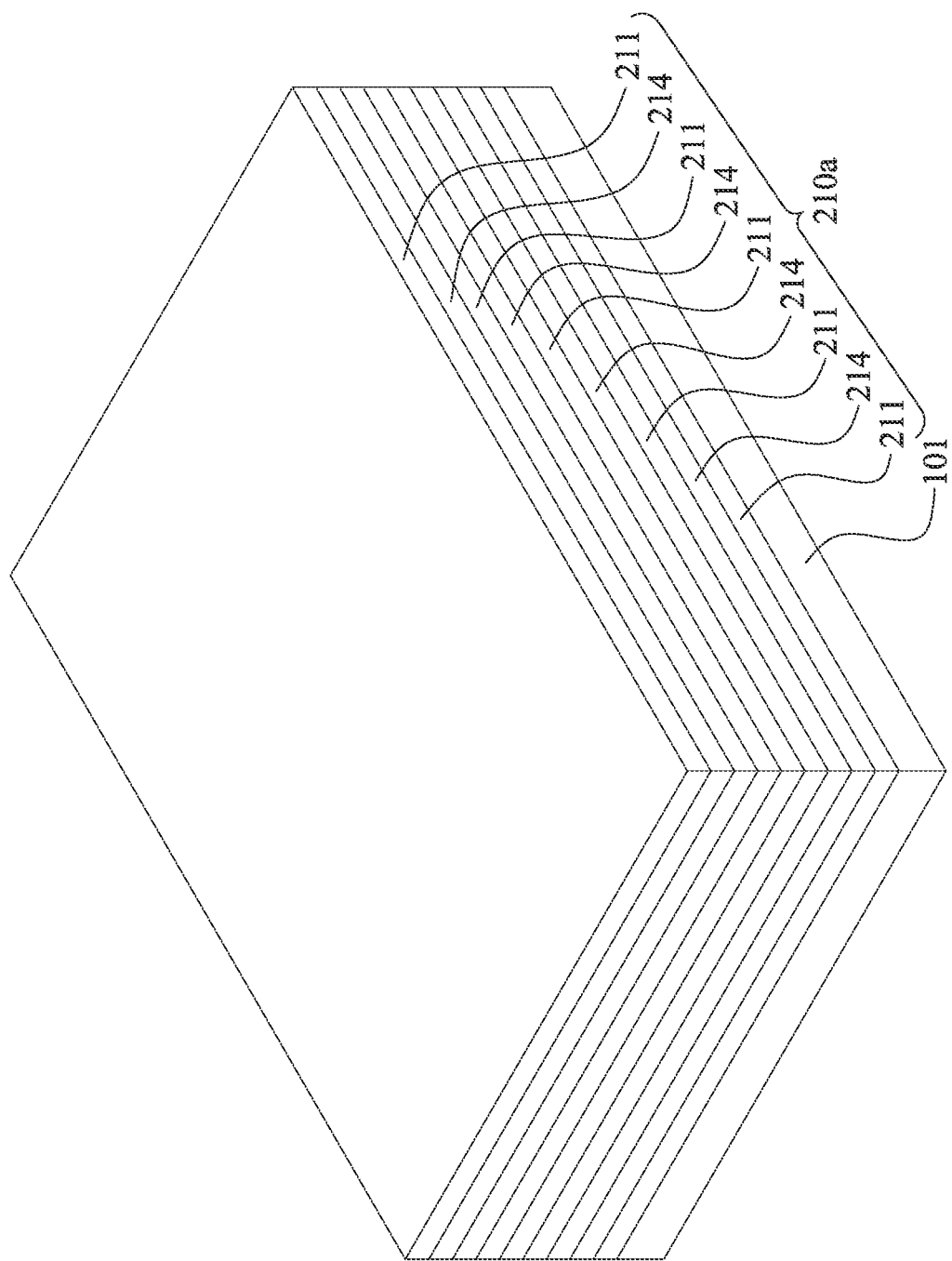
FIGS. 6, 7, 8, 9, 10A, 11A, 12A, 13A, 14A, 15, 16 and 17 are perspective views illustrating various stages in a method for forming a semiconductor memory structure according to aspects of one or more embodiments of the present disclosure.
Figure 6:
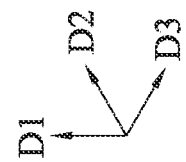

Method 400 begins at operation 401 by forming a stack 210a of alternating insulating layers 211 and first sacrificial layers 214 over a substrate 101, as shown in FIG. 6. In some embodiments, the substrate 101 is provided as having already undergone several processing steps. In some embodiments, the substrate 101 may be any suitable substrate such as a silicon, germanium, silicon-germanium, undoped, doped, bulk, silicon-on-insulator ("SOI") or other substrate with or without additional circuitry. In some embodiments, the stack 210a includes a plurality of insulating layers 211 and a plurality of first sacrificial layers 214, which are parallel to each other and sequentially stacked along a first direction D1. In some embodiments, the uppermost layer of the stack 210a is the insulating layer 211. In some embodiments, the number of the alternating layers included in the stack 210a can be made as high as the number of layers needed. In some embodiments, the stack 210a may include between 16 and 512 layers of alternating insulating layers 211 and first sacrificial layers 214, whereby each insulating or sacrificial layer constitutes one layer. In some embodiments, the insulating layers 211 include an insulating material, such as oxides (e.g., silicon oxide ($SiO_2$)). In some embodiments, the first sacrificial layers 214 may include nitrides (e.g., silicon nitride (SiN)) or amorphous silicon. Other insulating materials may be used instead of silicon oxide. Other sacrificial materials may be used instead of silicon nitride. In some embodiments, each of the insulating layers 211 and the first sacrificial layers 214 may have substantially identical thickness. In some embodiments, the insulating layers 211 and the first sacrificial layers 214 for forming the alternating stack 210a may be deposited using any suitable technique, such as atomic layer deposition (ALD), plasma enhanced atomic layer deposition (PEALD), chemical vapor deposition (CVD), plasma enhanced chemical vapor deposition (PECVD), and sputtering. In some embodiments, the insulating layers 211 and the first sacrificial layers 214 may be deposited by PECVD.

Figure 7:
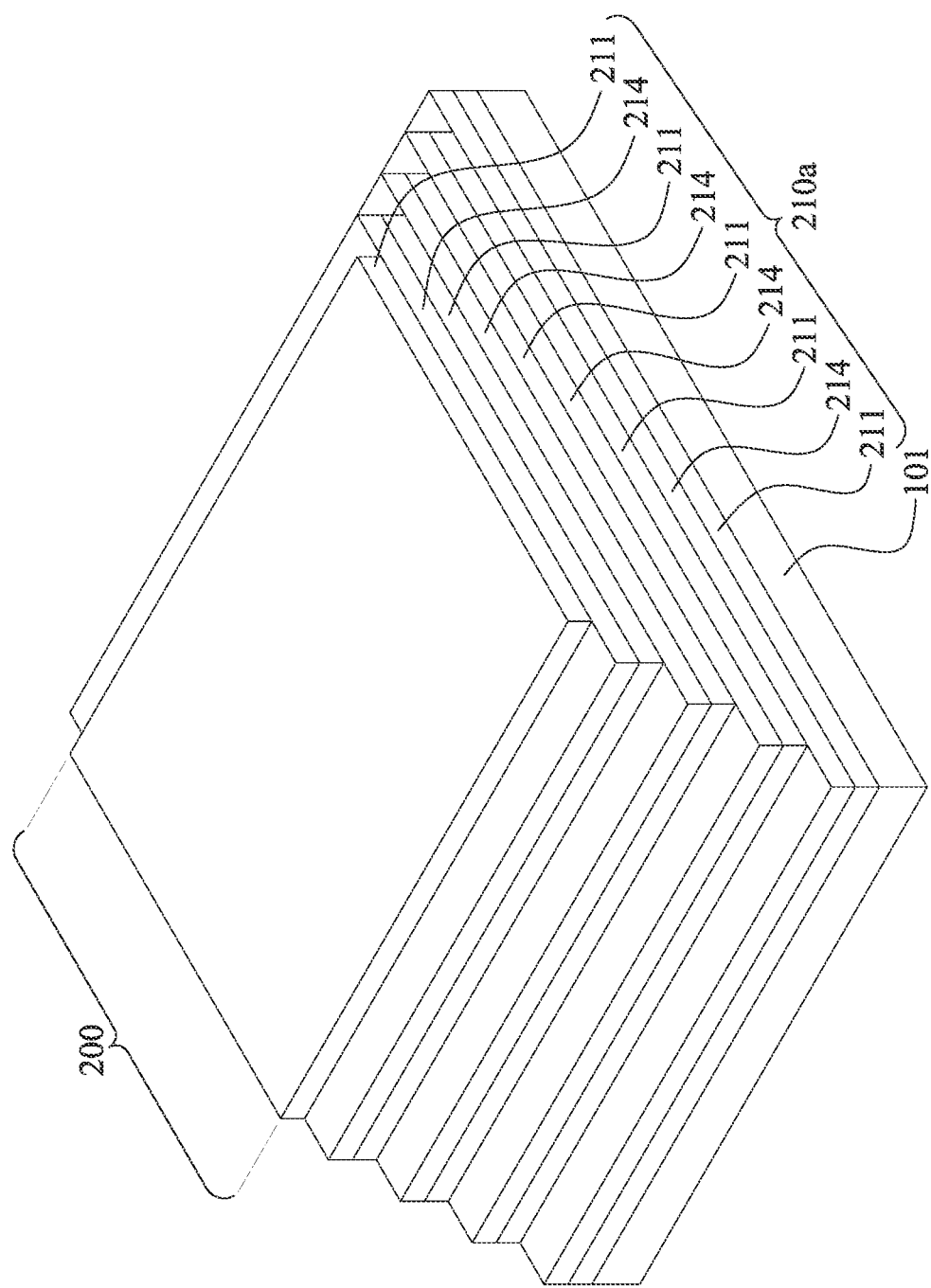
Figure 7:
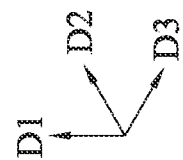

Referring to FIG. 7, portions of the insulating layers 211 and portions of the first sacrificial layers 214 are removed, such that remaining insulating layers 211 and remaining first sacrificial layers 214 form a staircase structure over the substrate 101. In some embodiments, portions of the first sacrificial layers 214 are exposed, and areas of the exposed portions of the first sacrificial layers 214 can be similar. In some embodiments, the remaining portion of the topmost insulating layer 211 can be used to define a location and a dimension of a cell array region 200.

Figure 8:
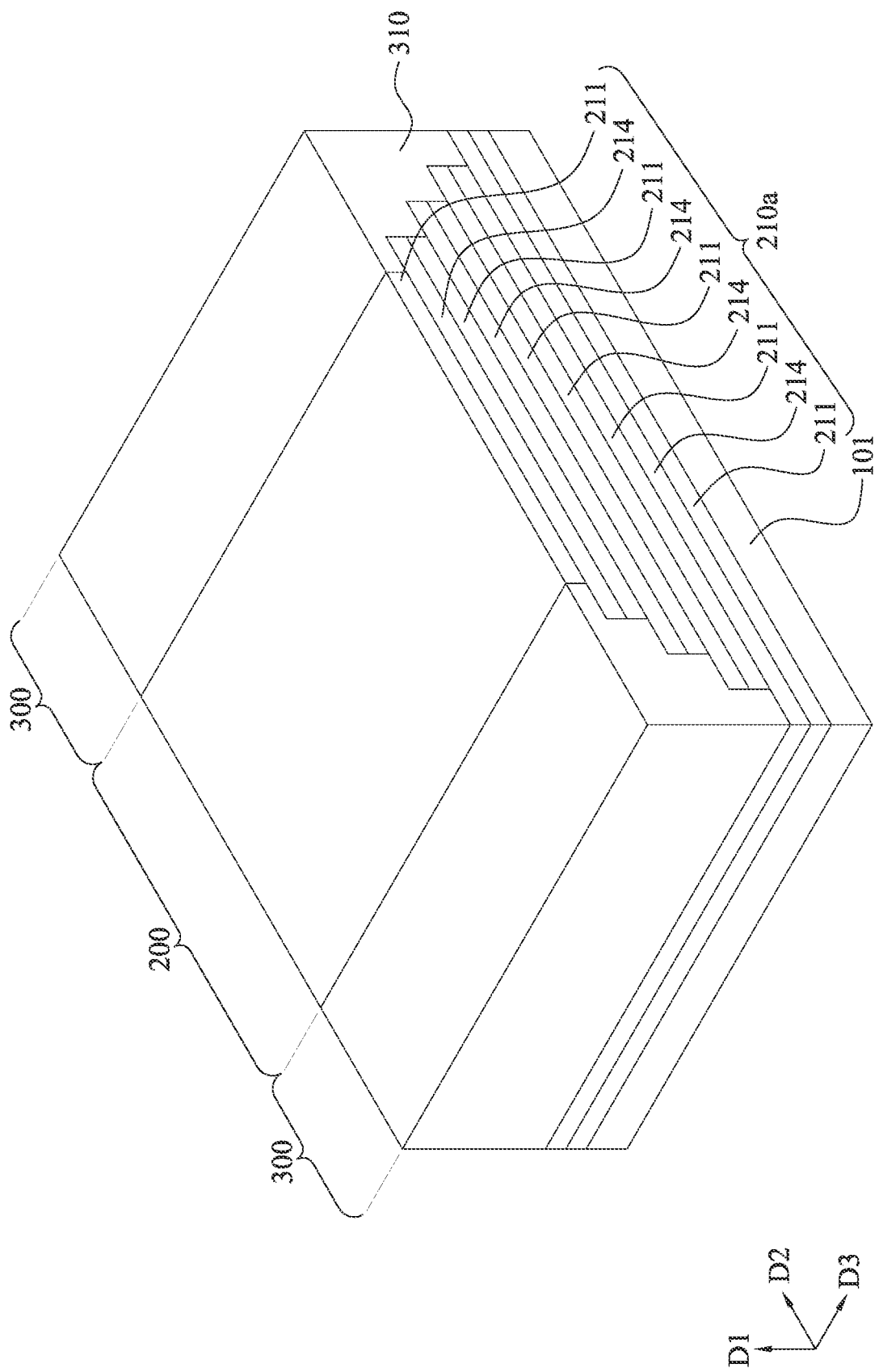

Referring to FIG. 8, in some embodiments, a dielectric structure 310 can be formed over the stack 210a. Further, a top surface of the dielectric structure 310 can be aligned with a top surface of the topmost insulating layer 211. Consequently, an even and flush surface can be obtained and the cell array region 200 is disposed between two connection regions 300.

Figure 9:
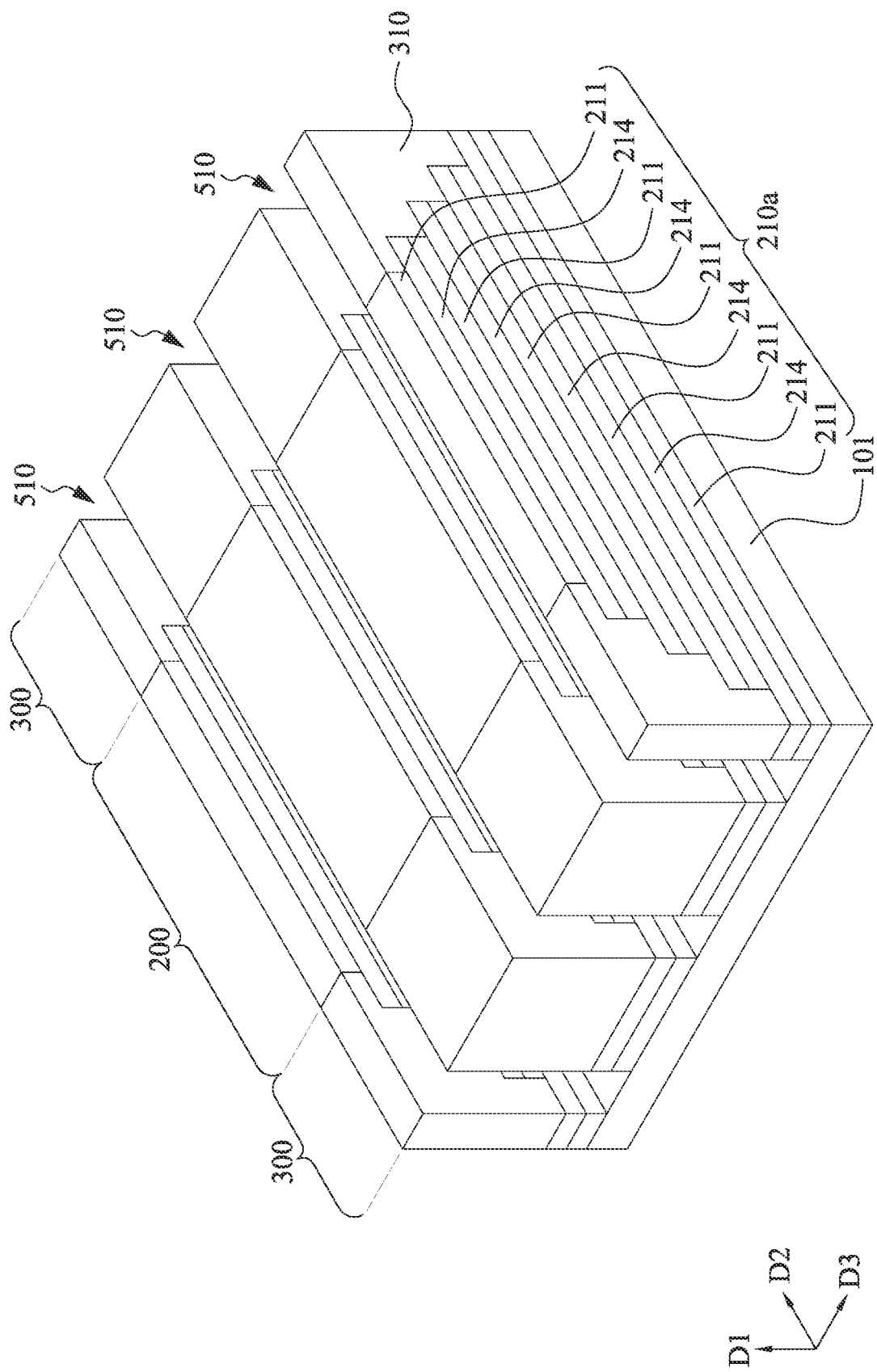

At operation 402 with reference to FIG. 9, in some embodiments, a plurality of first trenches 510 are formed in the cell array region 200 and the connection regions 300. In some embodiments, each of the trenches 510 extends along a second direction D2 and the first trenches 510 are arranged along a third direction D3, which is different from the first and second directions D1 and D2. In some embodiments, the first direction D1 and the second direction D2 are perpendicular to each other. In some embodiments, the third direction D3 is perpendicular to the first direction D2 and is also perpendicular to the first direction D1. Further, widths and depths of the first trenches 510 are similar to each other. In some embodiments, the substrate 101 can be exposed through a bottom of each trench 510, but the disclosure is not limited thereto. In some embodiments, the insulating layers 211 and the first sacrificial layers 214 can be exposed from the sidewalls of each trench 510.

Figure 10A:
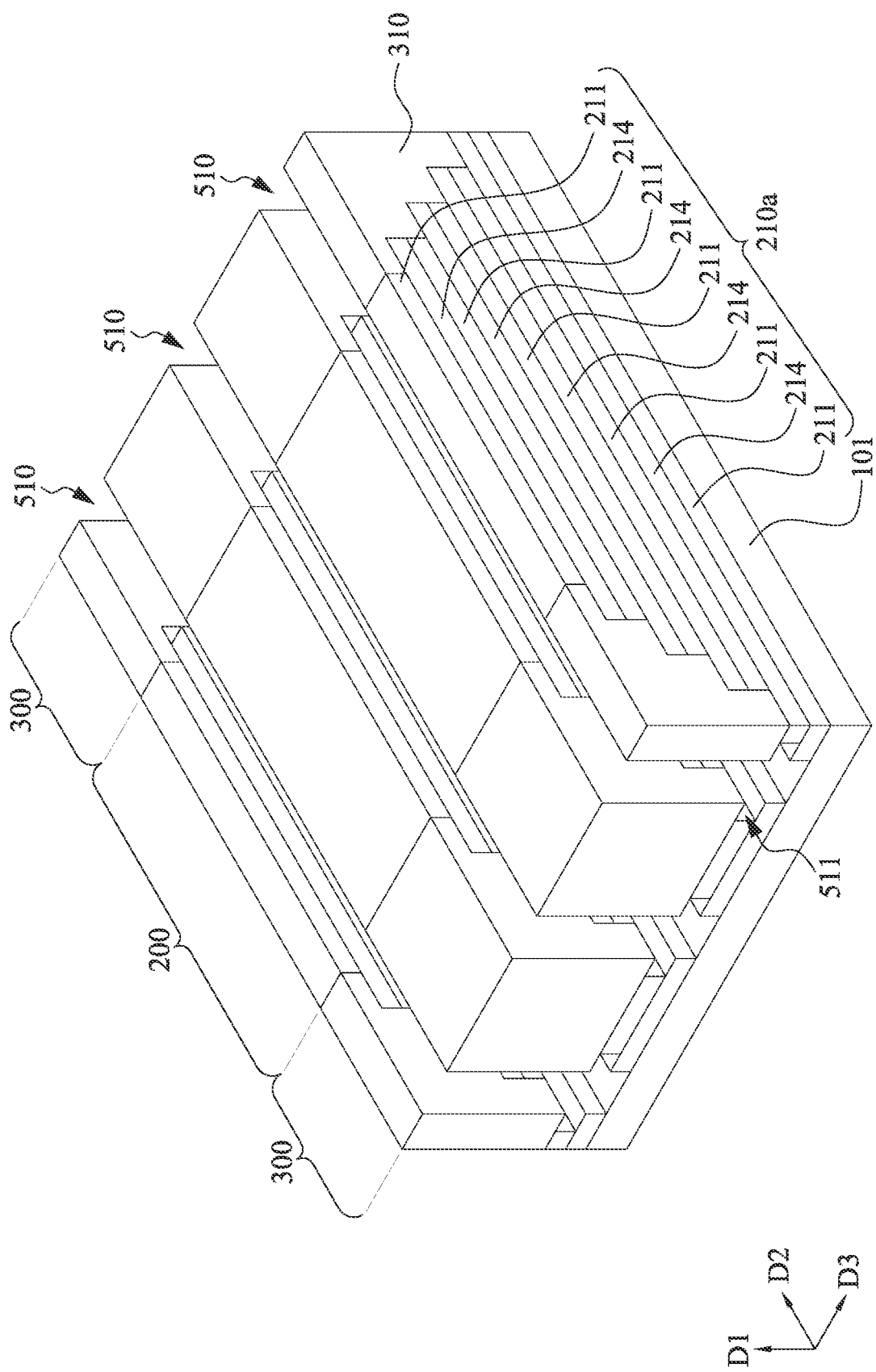
Figure 10B:
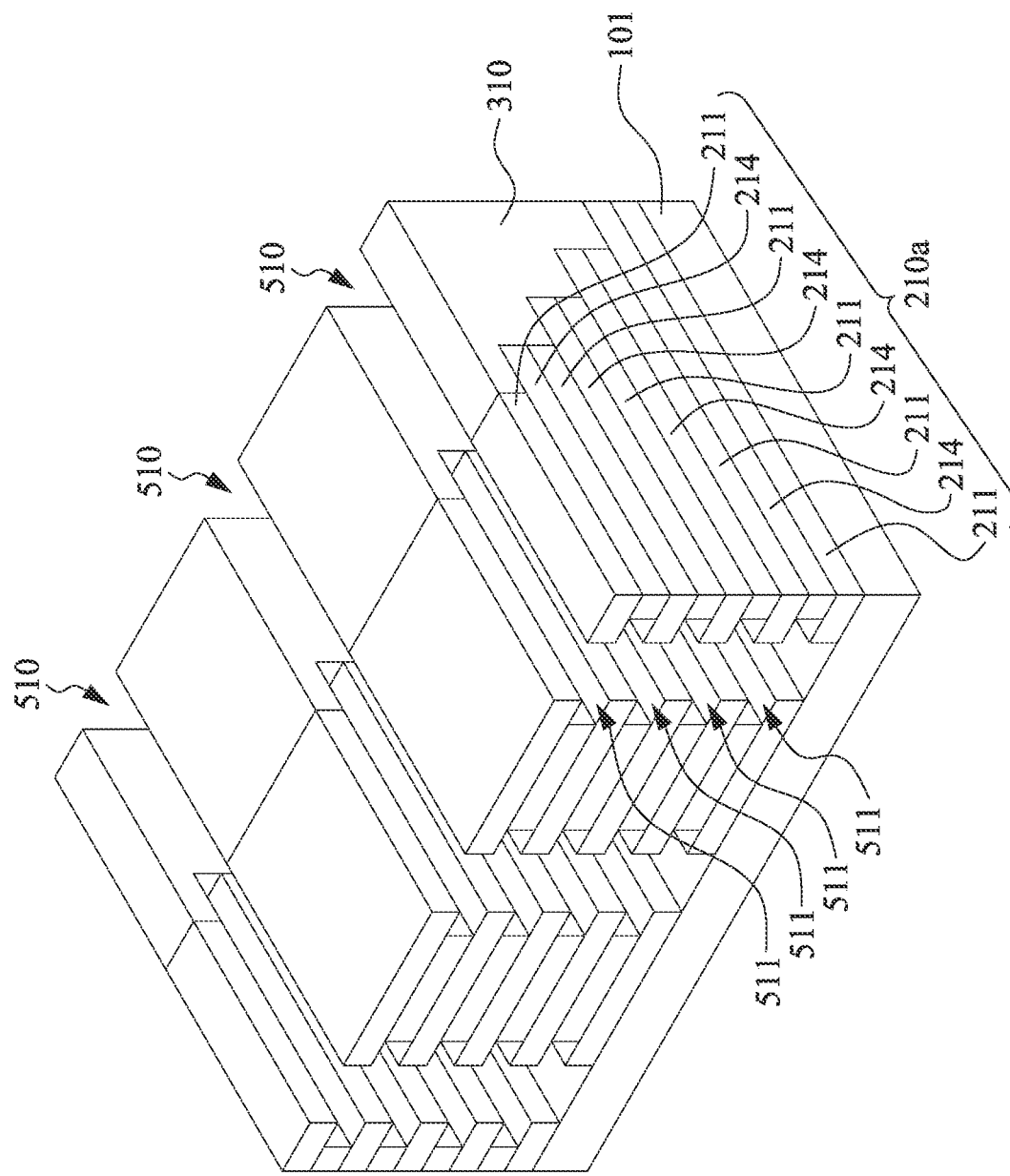
FIG. 10B is a perspective view of a portion of a semiconductor memory structure of FIG. 10A.

At operation 403, the first sacrificial layers 214 can be replaced by metal to form first conductive layers 212 (i.e. word lines). As shown in FIGS. 10A and 10B, some portions of the first sacrificial layers 214 may be removed from the first trenches 510 to form first recesses 511, so that the first sacrificial layers 214 will be replaced with conductive materials to form word lines. In some embodiments, the first sacrificial layers 214 (e.g., silicon nitride) can be selectively etched relative to insulating layers 211 (e.g., silicon oxide) over the substrate 101 via the first trenches 510. In some embodiments, the removal of the first sacrificial layers 214 may involve introducing an etchant via the first trenches 510. In some embodiments, etching may be performed using a selective dry etch process, such as by exposing the substrate to any one or more of the following gases: chlorine ($Cl_2$), oxygen ($O_2$), nitrous oxide ($N_2O$), or the like, but the disclosure is not limited thereto. It will be understood that the selective etching involves etching a first sacrificial layers 214 at a rate faster than etching materials for insulating layers 211. Any suitable etching process and etchant may be used.

Figure 11A:
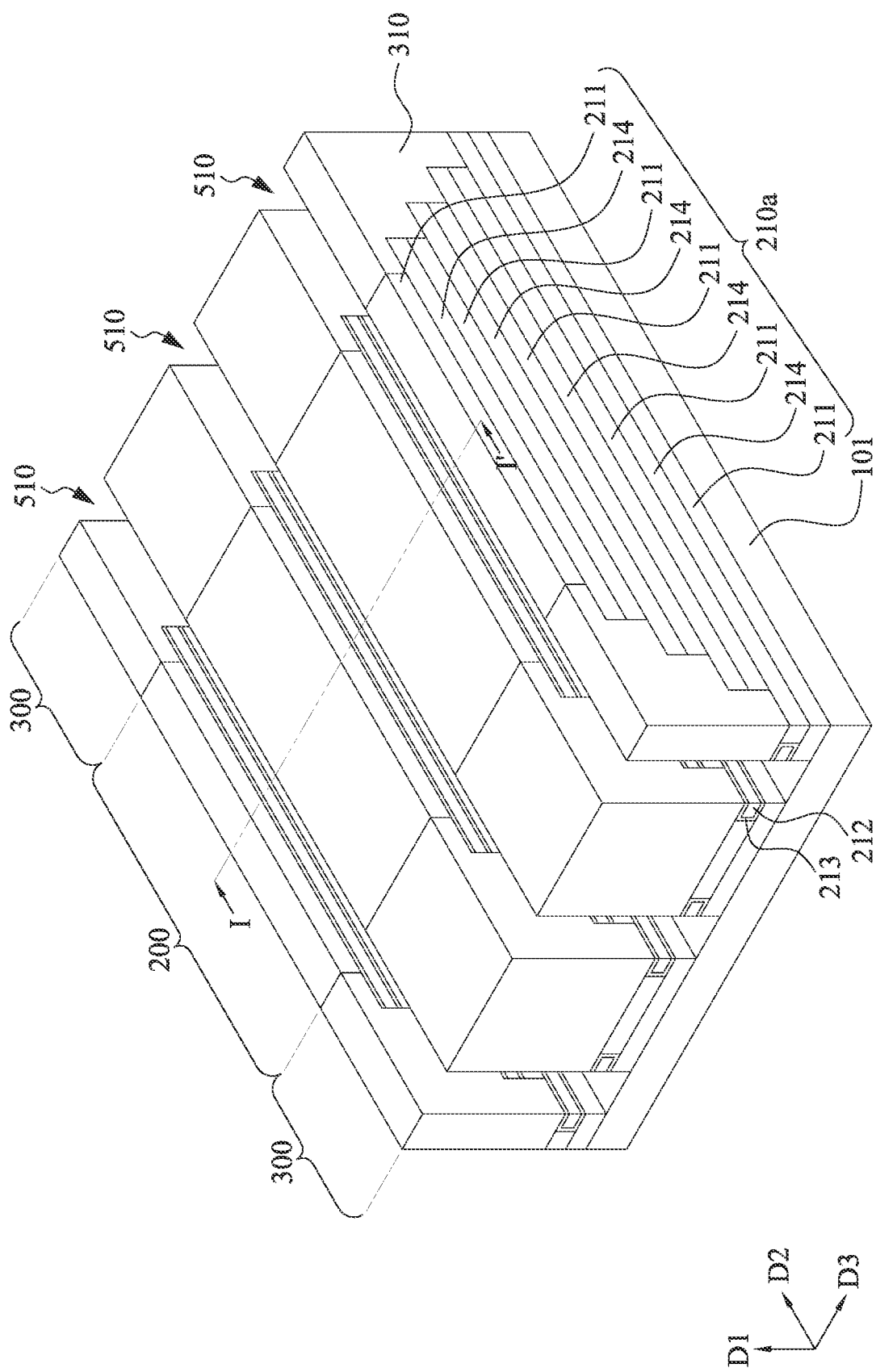
Figure 11B:
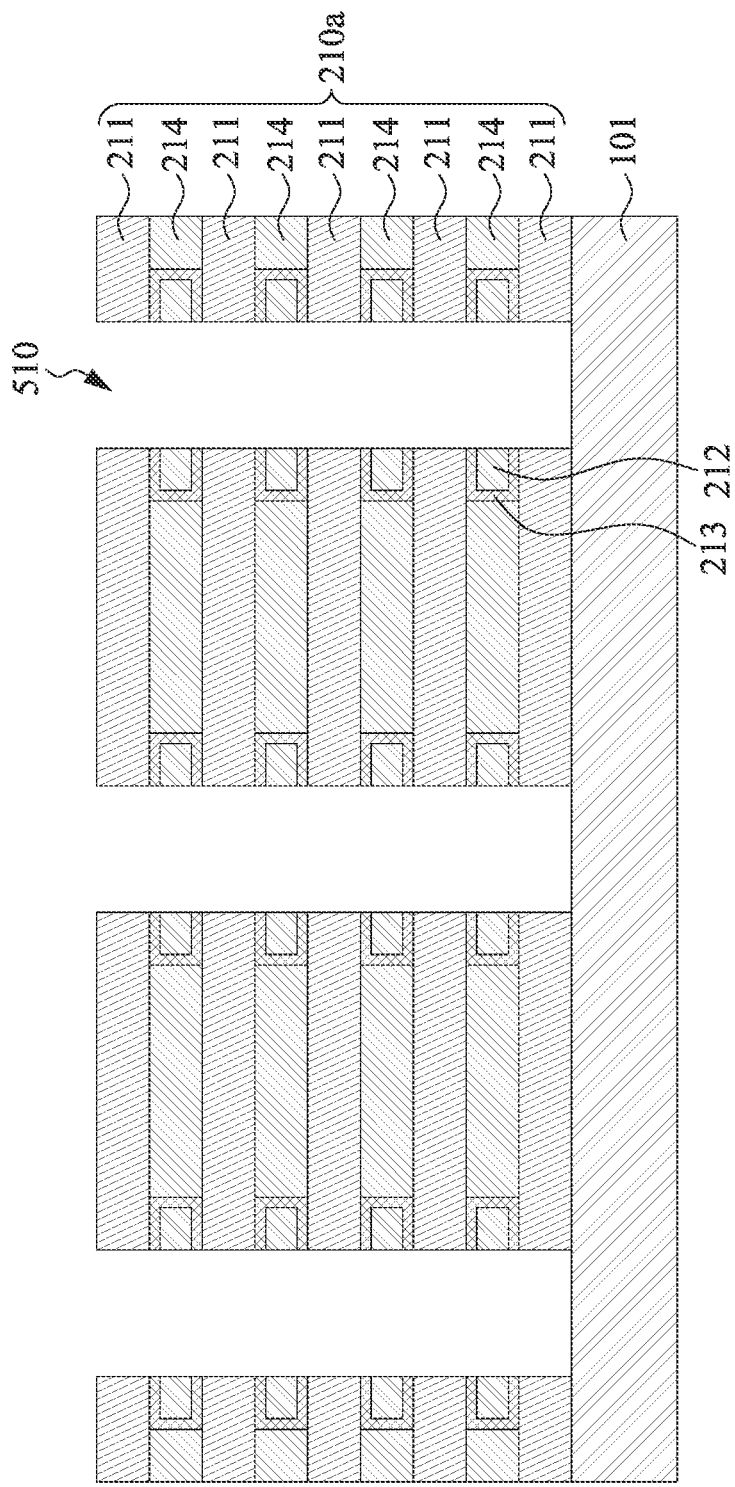
FIGS. 11B, 12B, 13B and 14B are schematic cross-sectional views taken along line I-I' of FIGS. 11A, 12A, 13A and 14A.
Figure 12A:
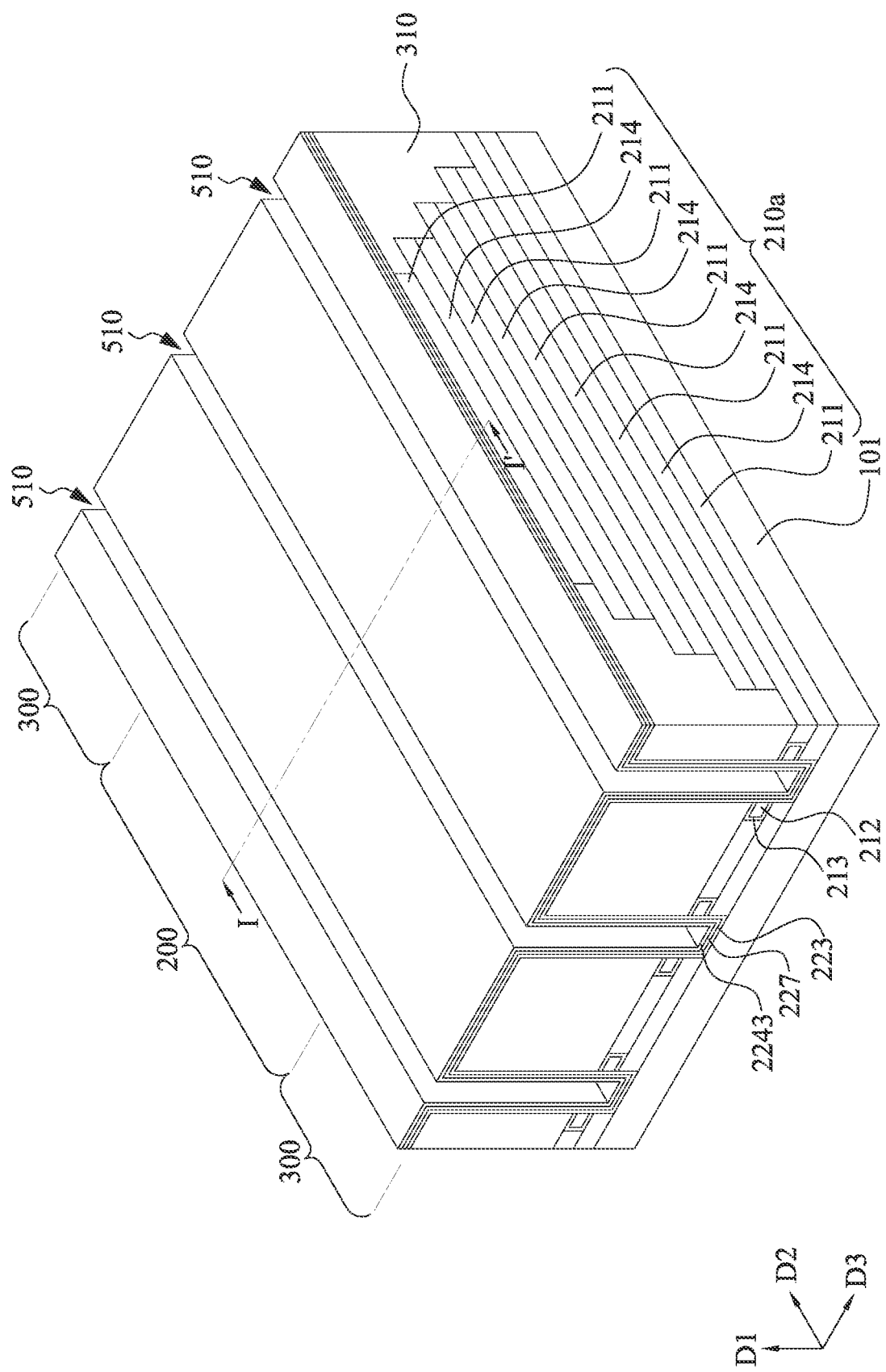
Figure 12B:
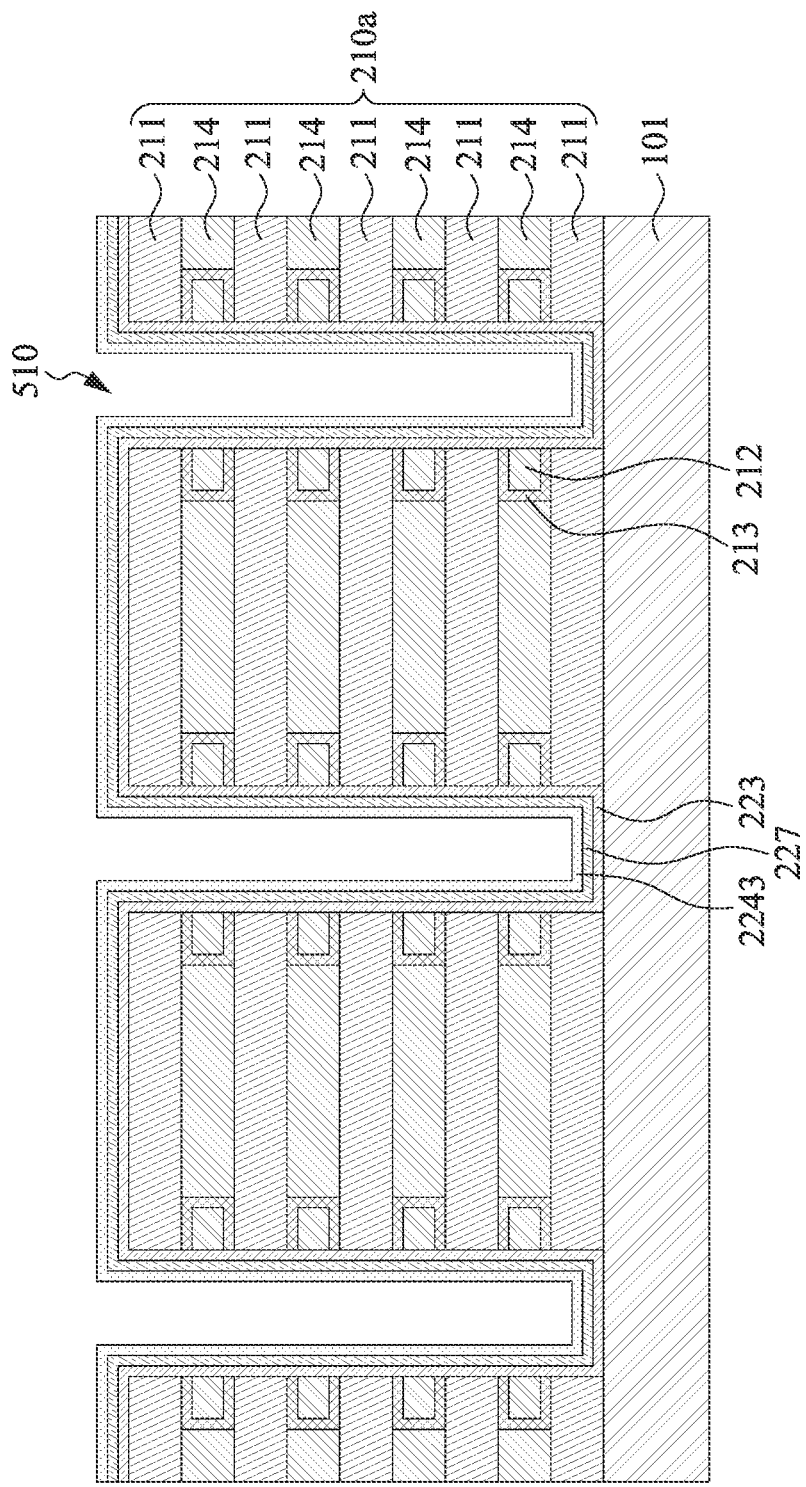

With further reference to FIGS. 11A and 11B, first conductive layers 212 can be formed in the first recesses 511 via the first trenches 510 to form word lines. After replacing the first sacrificial layers 214 with the first conductive material 212, a metal/oxide stack is formed, in which the insulating layers 211 (e.g., silicon oxide ($SiO_2$)) can separate the metal word lines. In some embodiments, the first conductive layers 212 include various conductive materials, e.g., metal such as aluminum (Al), titanium (Ti), cobalt (Co), silver (Ag), gold (Au), copper (Cu), nickel (Ni), chromium (Cr), hafnium (Hf), rhodium (Ru), tungsten (W), platinum (Pt) and/or alloys thereof, or a metal nitride such as titanium nitride (TiN), tantalum nitride (TaN), or the like, but the disclosure is not limited thereto. In some embodiments, chemical vapor deposition (CVD) or atomic layer deposition (ALD) may be used to deposit the first conductive layers 212. In some embodiments, the excessive conductive material, e.g., the materials outside the recesses, at the bottom of the first trenches 510, and on the surface of the uppermost insulating layers 211, can be removed. e.g., by etching, so that the bottom surfaces of the first trenches 510, the sidewalls of the insulating layers 211, and the surface of the uppermost insulating layers 211 can be exposed.

In some embodiments, before forming the first conductive layers 212 in the first recesses 511, glue layers 213 may be formed along the sidewall of the first recesses 511, so that the shape of glue layers 213 corresponds to the sidewall of the first recesses 511. For example, each glue layer 213 may have a U shape, V shape, W shape and so on, depending on the shape of the sidewalls of the recesses 511, but the disclosure is not limited thereto. The glue layers 213 may be formed by using ALD, CVD, physical vapor deposition (PVD) or other methods. Each glue layer 213 partially surrounds the corresponding first conductive layer 212, so that the first conductive layer 212 can be exposed from the first trench 510 but not contact the adjacent insulating layers 211 and/or dielectric structure 310. The glue layer 213 can improve adhesion of the first conductive layer 212 with adjacent insulating layers 211 and/or dielectric structure 310.

Operation 404 includes filling each of the first trenches 510 with a multi-layered structure. The multi-layered structure can be formed by any suitable methods that are known in the art. In some embodiments, referring to FIGS. 12A and 12B, the first trenches 510 may be filled in by sequentially depositing a ferroelectric layer 223, a semiconductor layer 227 and a dielectric layer 2243 along the sidewalls and bottoms of the first trenches 510, e.g., using ALD. In some embodiments, other suitable layers, such as an interfacial layer, e.g., $SiO_2$, $SiON$, or $Al_2O_3$, can be formed in combination with the ferroelectric layer 223.

Figure 13A:
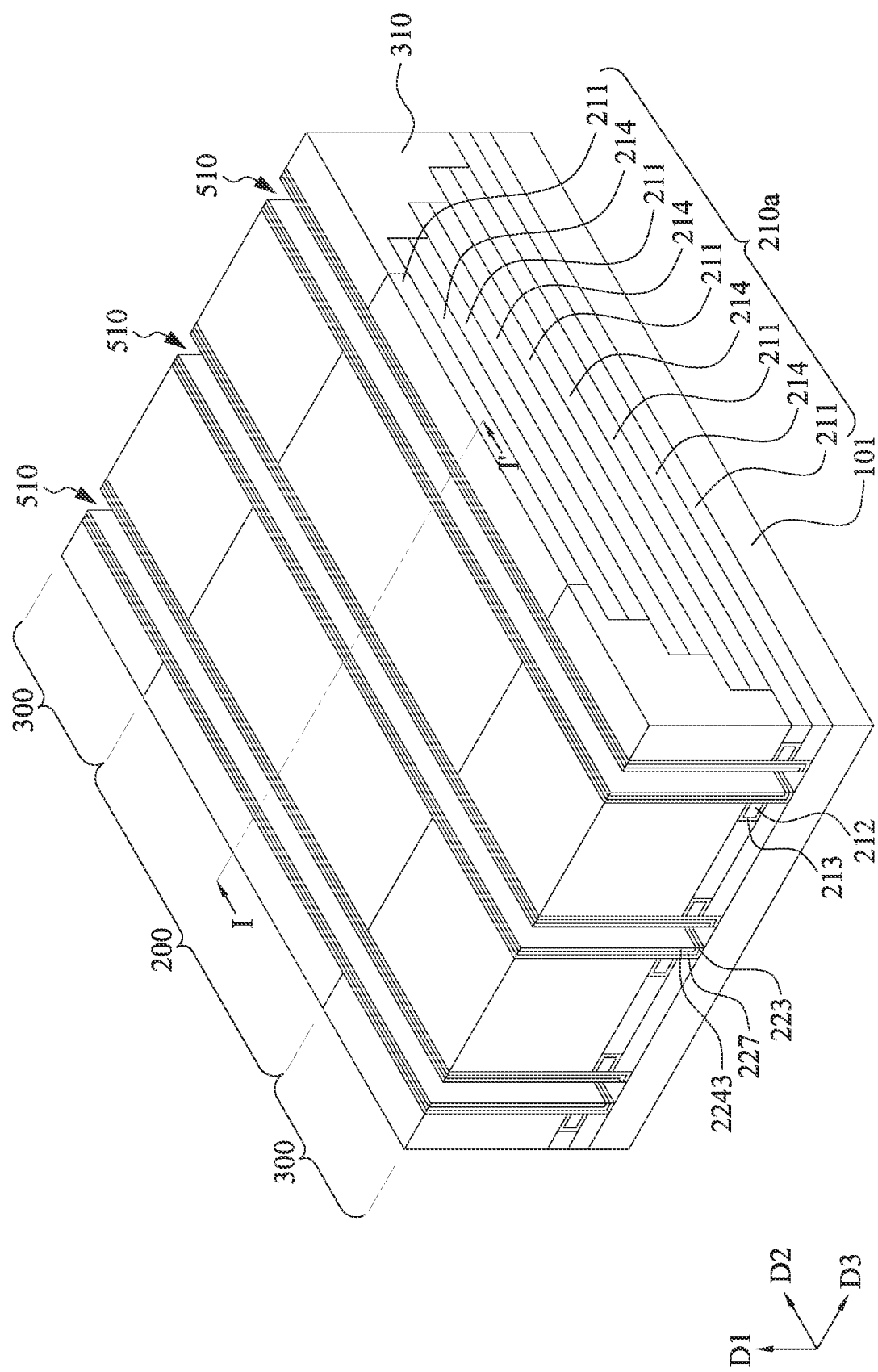
Figure 13B:
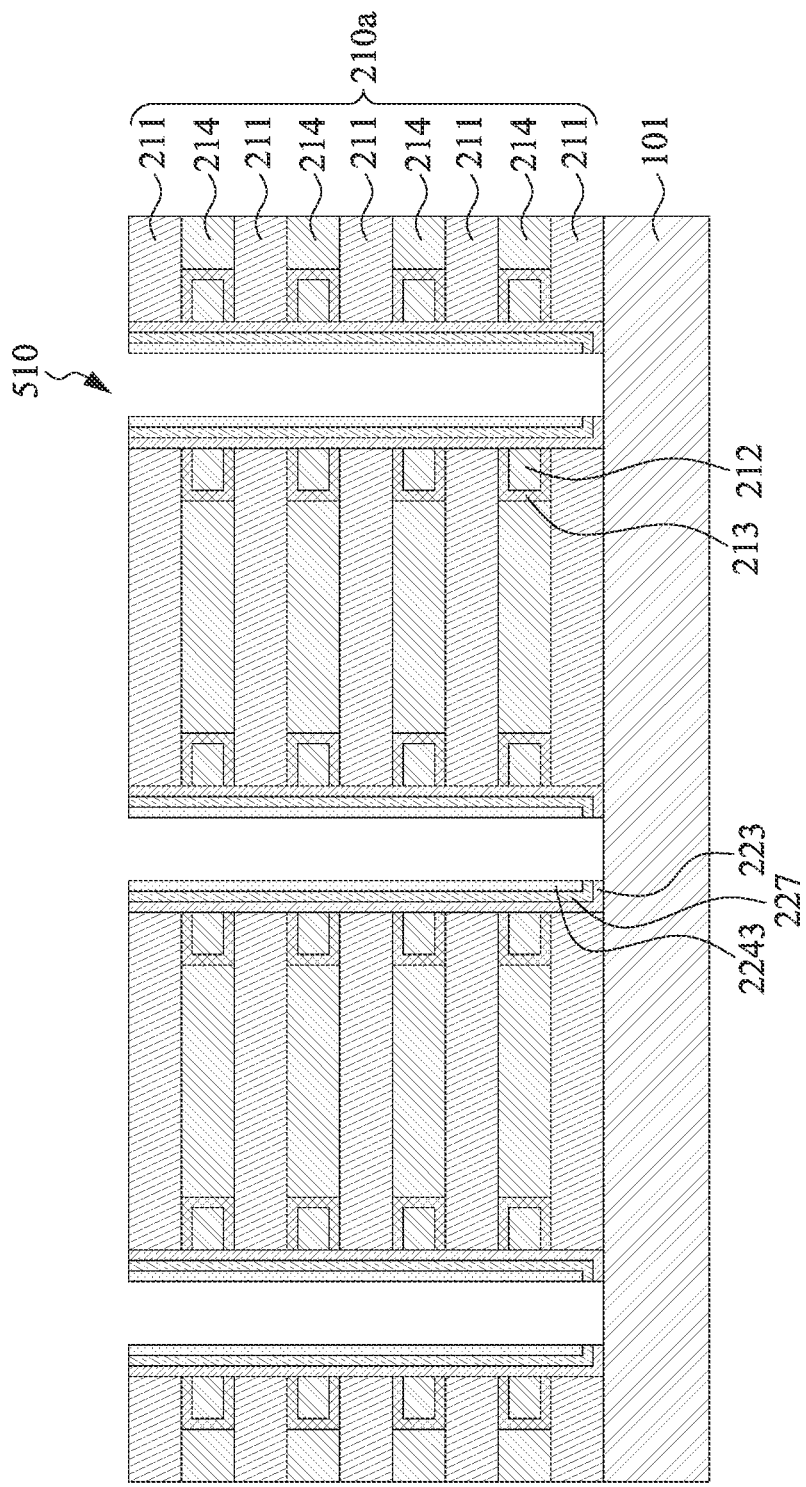

In some embodiments, with reference to FIGS. 13A and 13B, portions of the ferroelectric layer 223 and portions of the semiconductor layer 227 may be removed from the bottom of the first trenches 510, so as to expose the substrate 101 from the first trenches 510. Hence, from the cross-sectional side view, the ferroelectric layer 223 has an L-shaped vertical cross section; correspondingly, the semiconductor layer 227 forming along the ferroelectric layer 223 also has an L-shaped vertical cross section as shown in FIG. 13B.

Figure 14A:
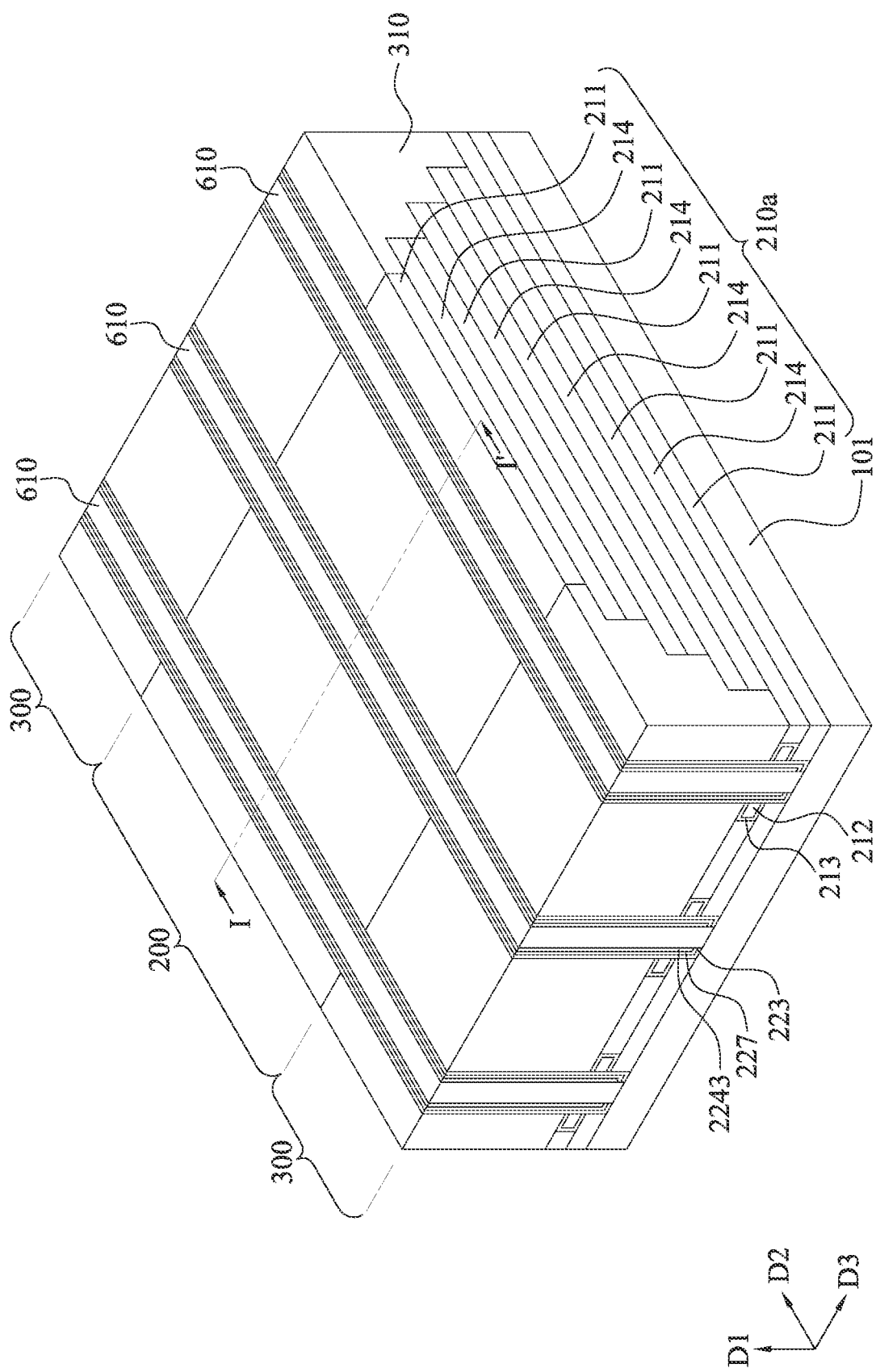
Figure 14B:
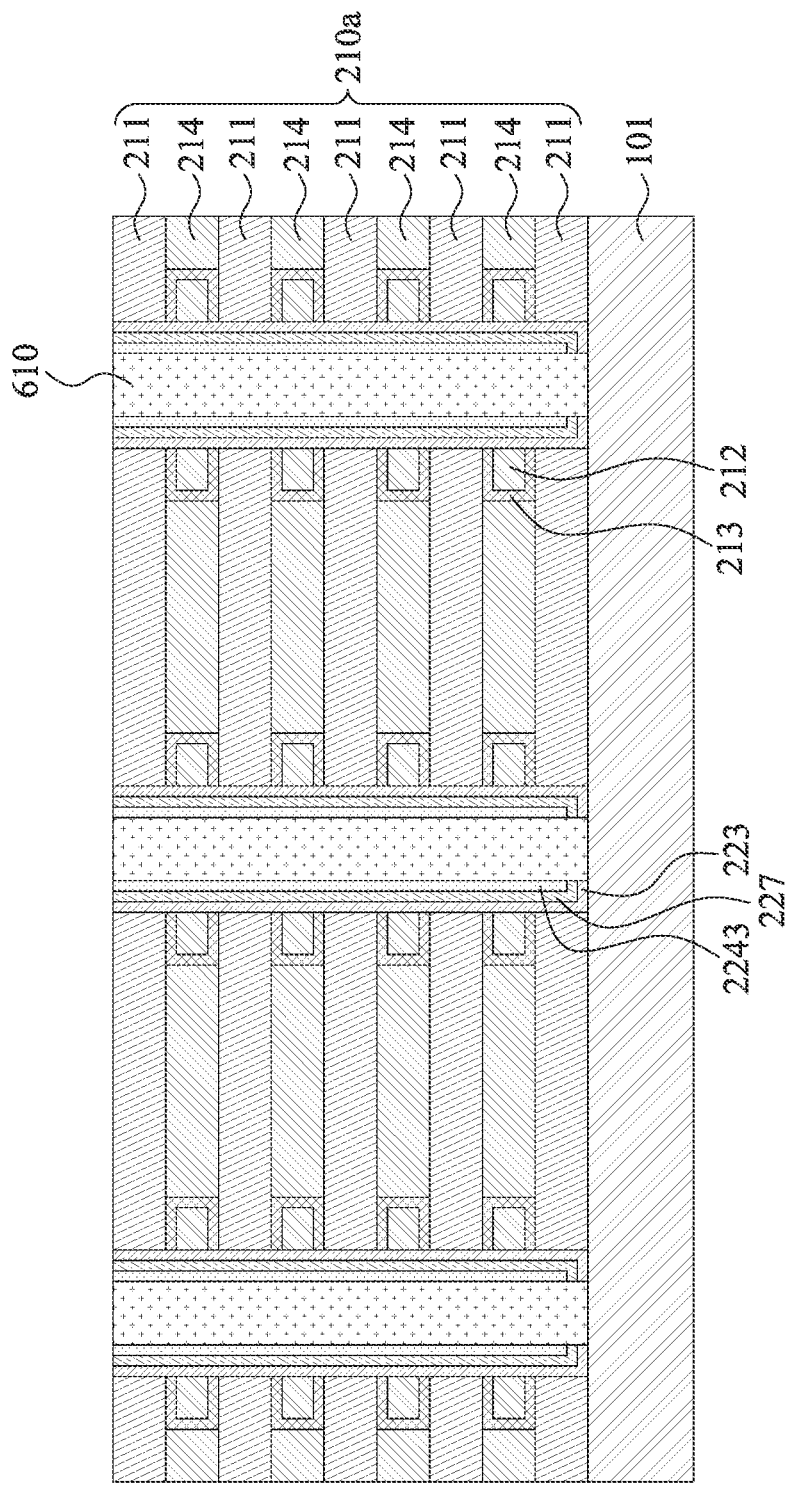

Referring to FIGS. 14A and 14B, the first trenches 510 can be filled with a first sacrificial material 610. In some embodiments, after filling the first trenches 510 with these layers, a chemical mechanical polishing (CMP) may be carried out to planarize the surface of the structure. The first sacrificial material 610 may include nitrides (e.g., silicon nitride (SiN)) or amorphous silicon, but the disclosure is not limited thereto.

Figure 15:
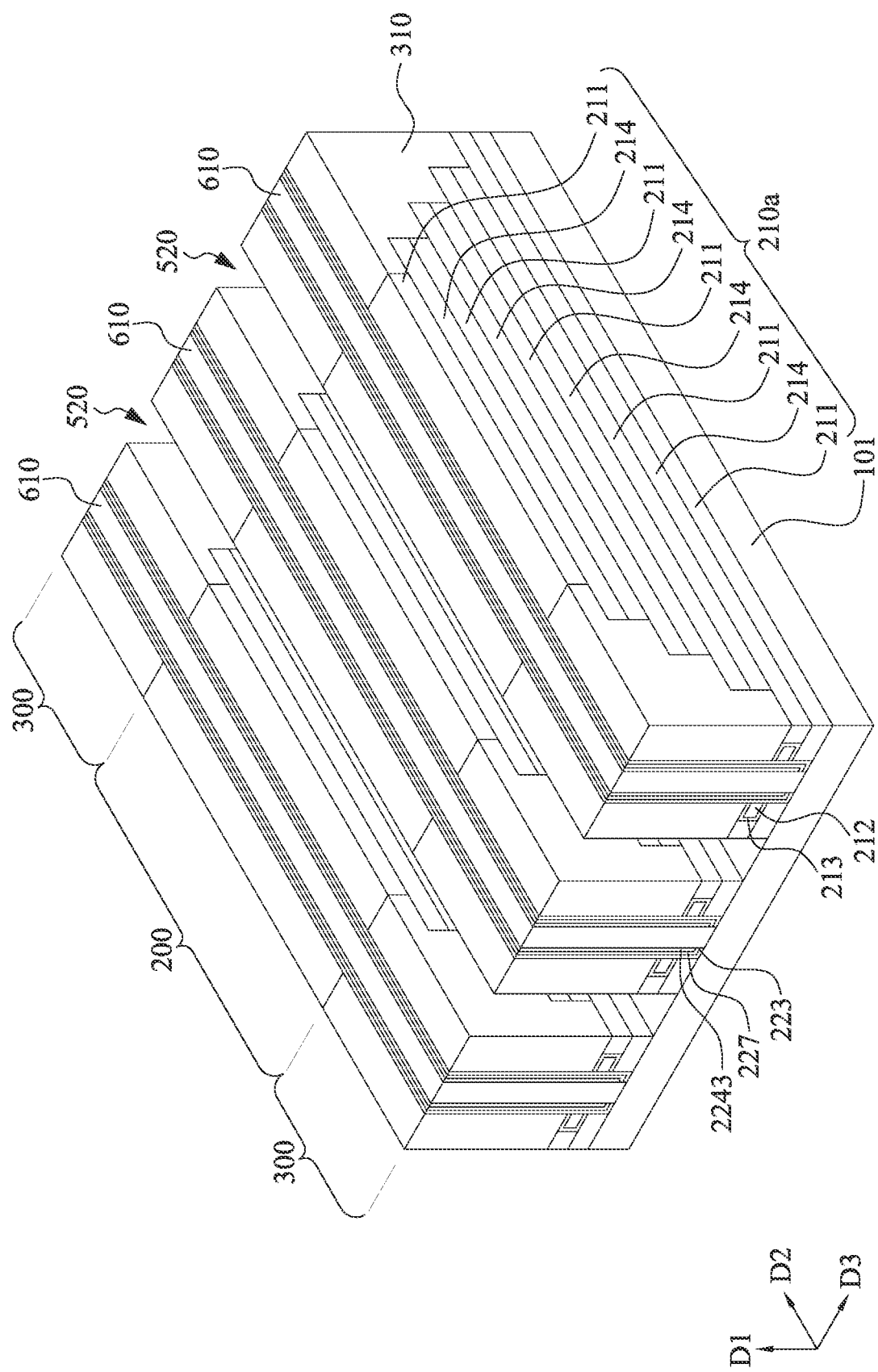
Figure 16:
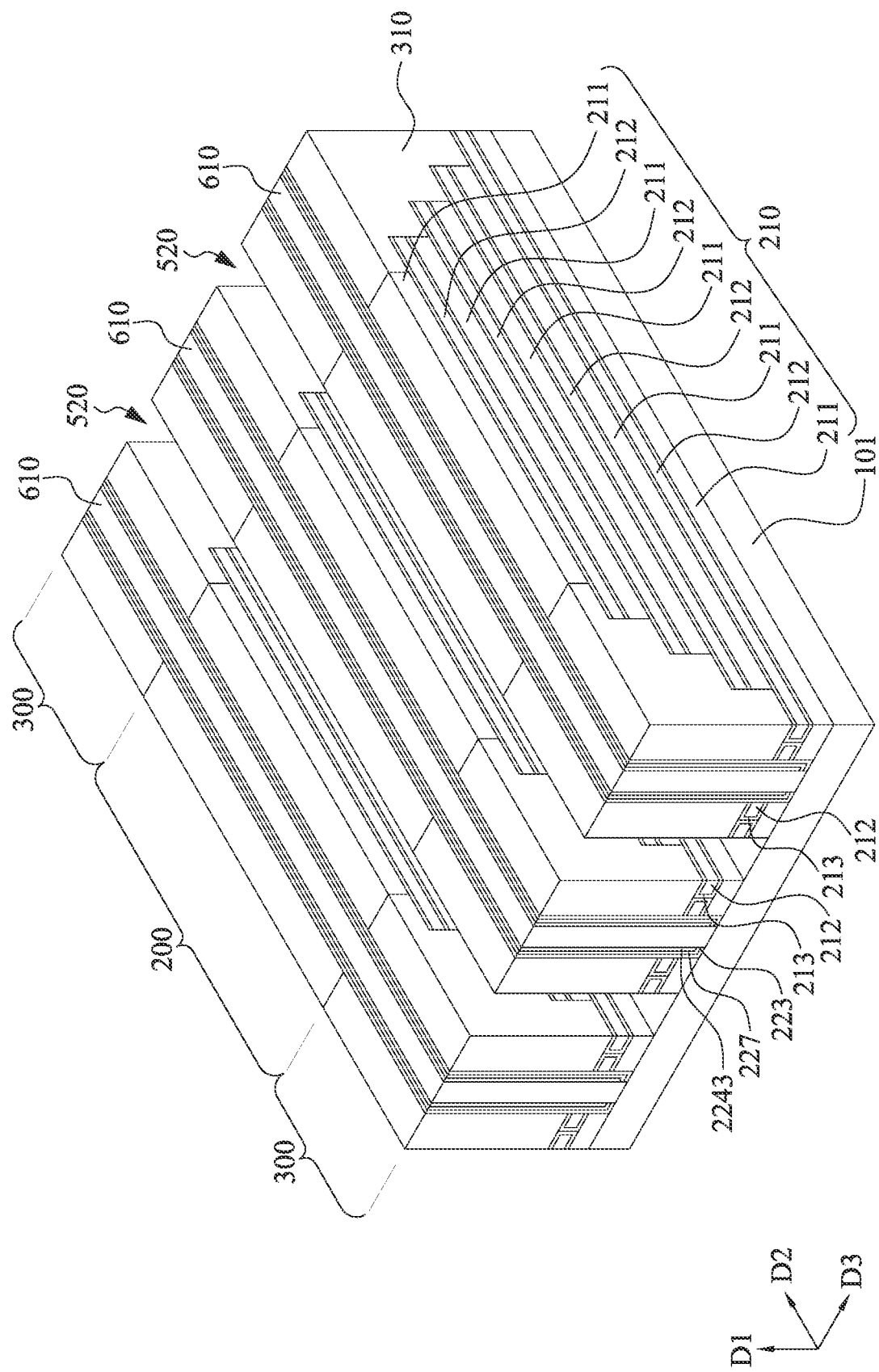
Figure 17:
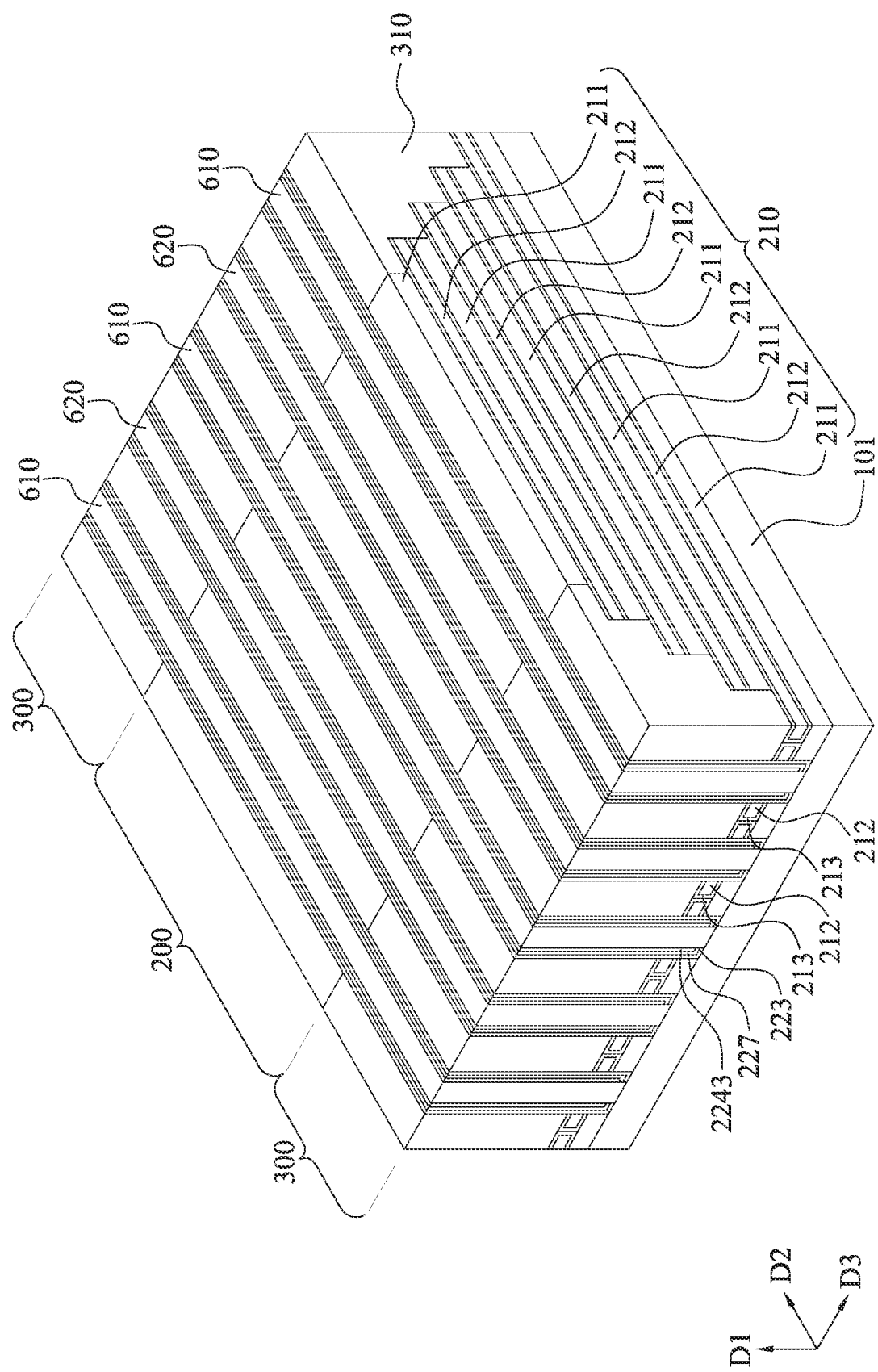

Operations 402 to 404 may be performed twice or more times. FIG. 15 shows that second trenches 520 can be formed in the cell array region 200 and the connection regions 300 to expose the first sacrificial layers 214 from the second trenches 520. Each second trench 520 can be formed at a location between two multi-layered structure filled in the first trenches 510. FIG. 16 shows that the first sacrificial layers 214 can be replaced by metal to form first conductive layers 212 (i.e. word lines); and, in some embodiments, glue layers 213 may be formed to adhere the first conductive layers 212 to adjacent insulating layers 211 and/or adjacent glue layers 213 previously formed through the first trenches 510. FIG. 17 shows that each of the second trenches 520 are filled with a multi-layered structure, including a ferroelectric layer 223, a semiconductor layer 227, a dielectric layer 2243 and a second sacrificial material 620, identical or similar to the multi-layered structure formed in the first trenches 510; therefore, repeated descriptions of such details are omitted for brevity. The second sacrificial material 620 may include nitrides (e.g., silicon nitride (SiN)) or amorphous silicon, but the disclosure is not limited thereto. In some embodiments, widths of the multi-layered structure in the first trenches 510 and widths of the multi-layered structure in the second trenches 520 are similar. As shown in FIG. 17, the multi-layered structures in the first trenches 510 and the multi-layered structures in the second trenches 520 are alternately arranged along the third direction D3. Further, distances between the adjacent multi-layered structures in the first trench 510 and the second trench 520 are similar.

Figure 18:
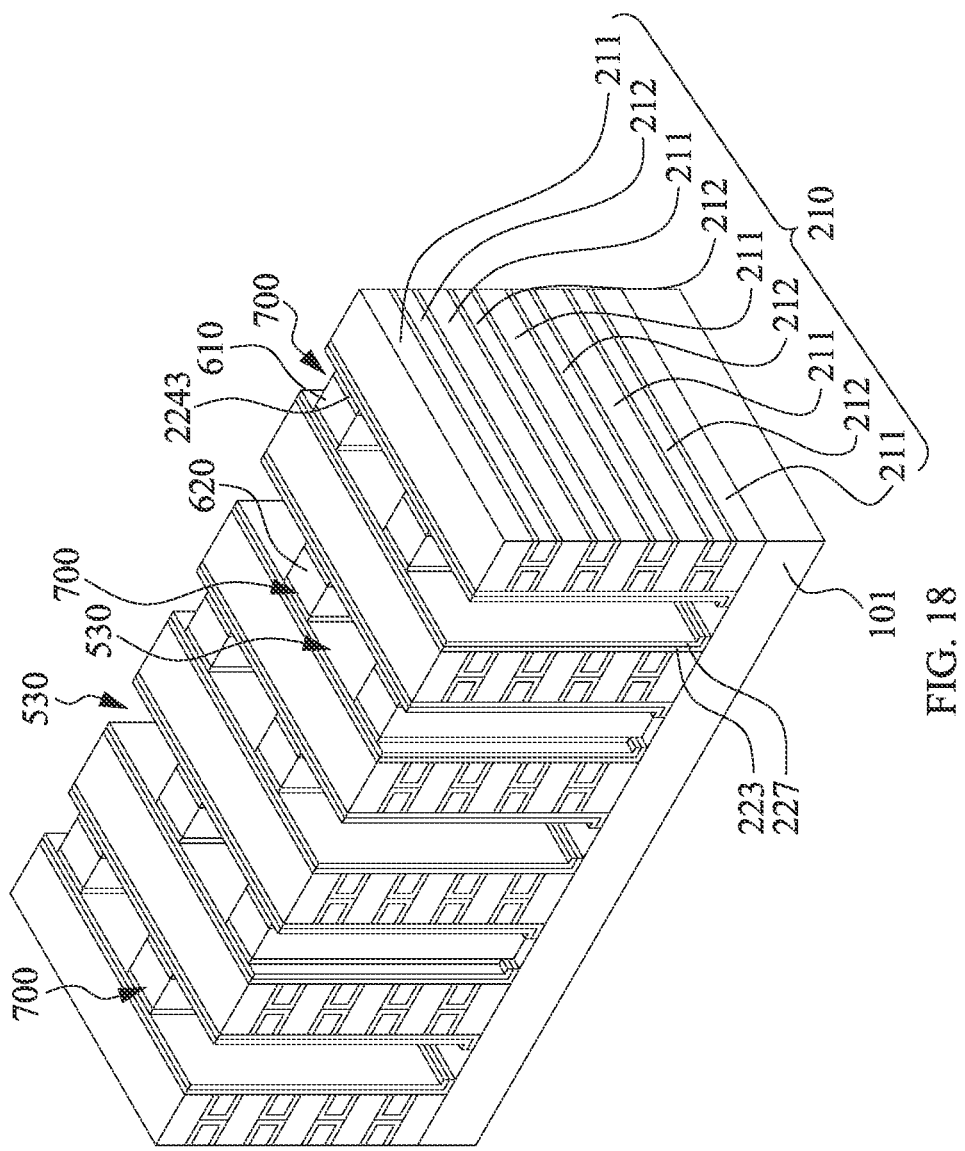
FIGS. 18, 19, 20, 21, 22, 23 and 24 are perspective views of a portion of a semiconductor memory structure in various stages subsequent to FIG. 17 in the method for forming a semiconductor memory structure according to aspects of one or more embodiments of the present disclosure.

At operation 405, with reference to FIG. 18, in some embodiments, portions of the first sacrificial material 610, portions of the second sacrificial material 620, and portions of the dielectric layer 2243 can be removed to form a plurality of third trenches 530. In some embodiments, the third trenches 530 are separated from each other by remaining portions 700, which is used to define the location of extension portions 2242 of first conductive structures 224 to be formed and is described below. The third trenches 530 and the remaining portions 700 are arranged alternately. The third trenches 530 are formed to expose a portion of the substrate 101. Each remaining portion 700 can be disposed between two semiconductor layers 227 and includes two dielectric layer 2243 formed separately along two semiconductor layers 227. In other words, the dielectric layer 2243 is sectioned by the third trenches 530. Further, the first and second sacrificial materials 610 and 620 are sandwiched by the two dielectric layers 2243. Hence, each remaining portion 700 has two opposite sides exposed from the third trenches 530.

Figure 19:
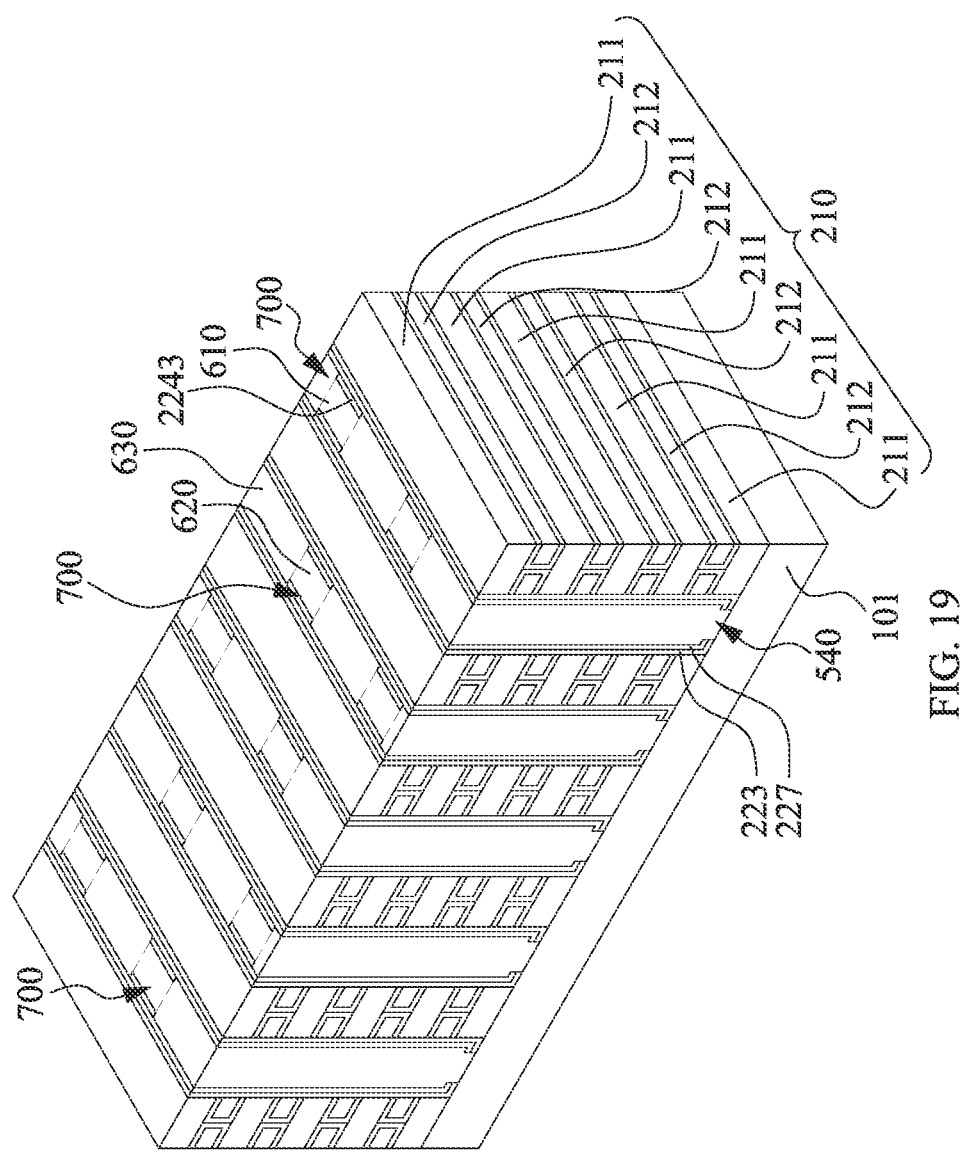
Figure 20:
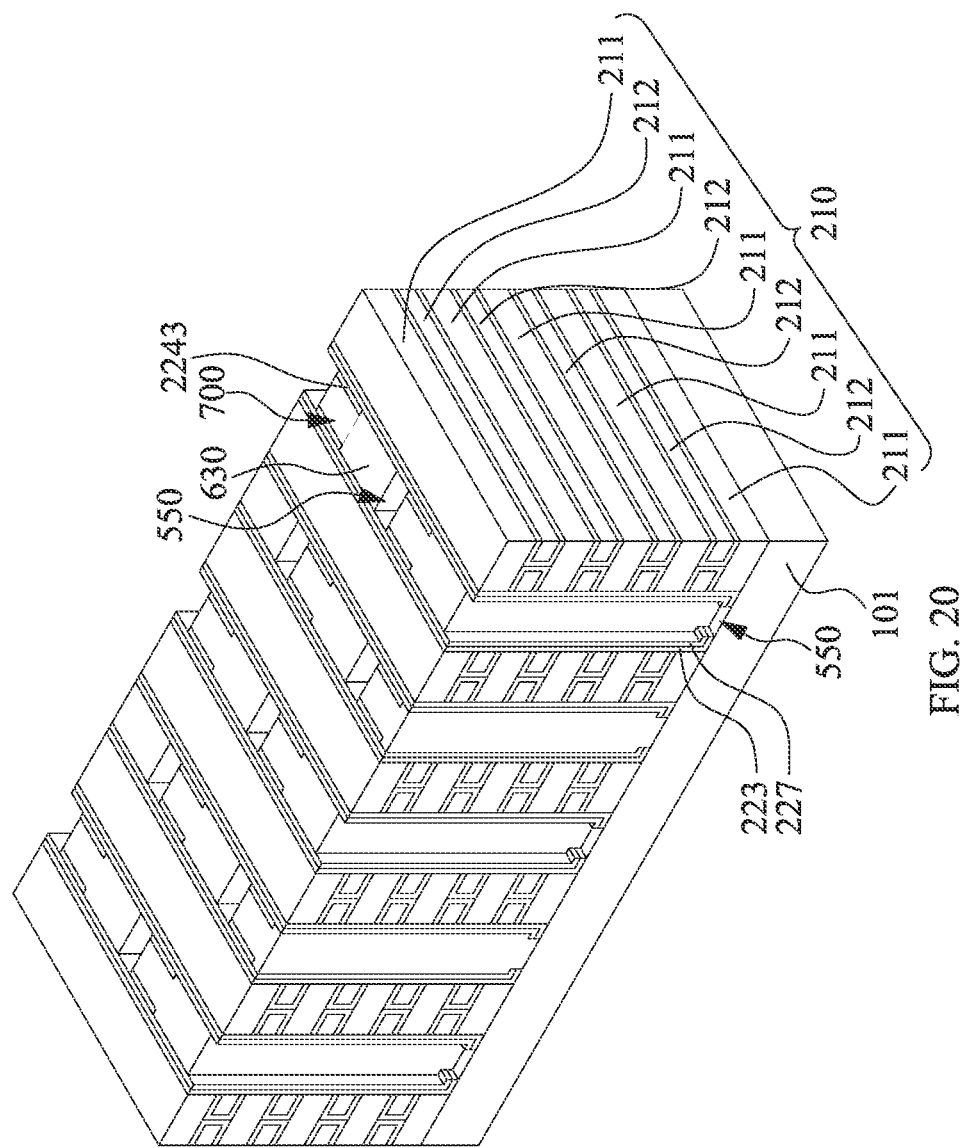
Figure 21:
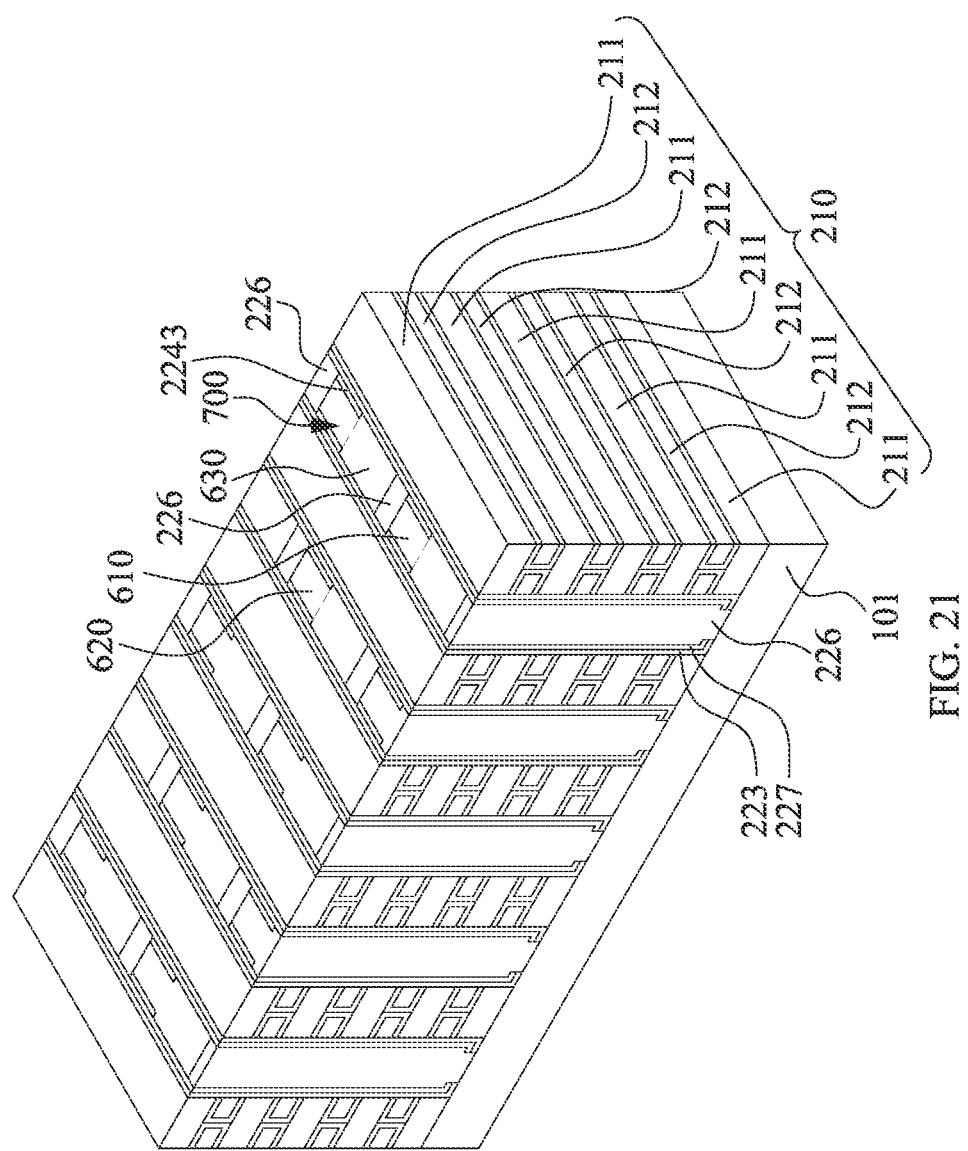

At operation 406, with reference to FIG. 19, the third trenches 530 may be filled with a third sacrificial materials 630. The third sacrificial materials 630 may be identical to or different from the first and second sacrificial materials 610 and 620. Referring to FIG. 20, a plurality of channel isolation trenches 550 can be formed next to one side of the remaining portions 700 by removing some portions of the third sacrificial materials 630. The channel isolation trenches 550 can extend downwardly from the top surface of the cell array region 200 to expose the substrate 101, so one side of each remaining portion 700 and two semiconductor layers 227 can be exposed from the channel isolation trenches 550. Referring to FIG. 21, the channel isolation trenches 550 can be filled with isolation material, such as an isolation oxide (e.g., $SiO_2$) or other suitable materials, to form channel isolation structure 226.

Figure 22:
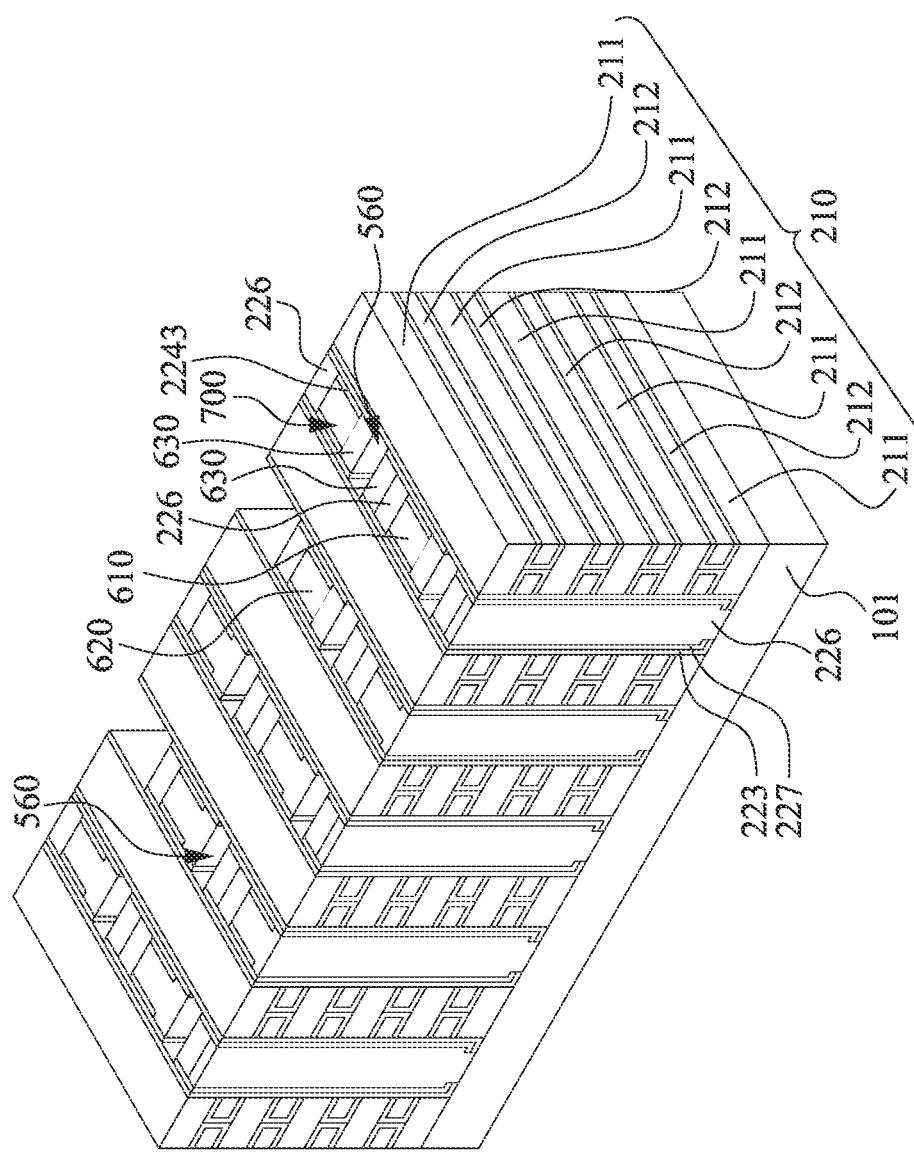
Figure 23:
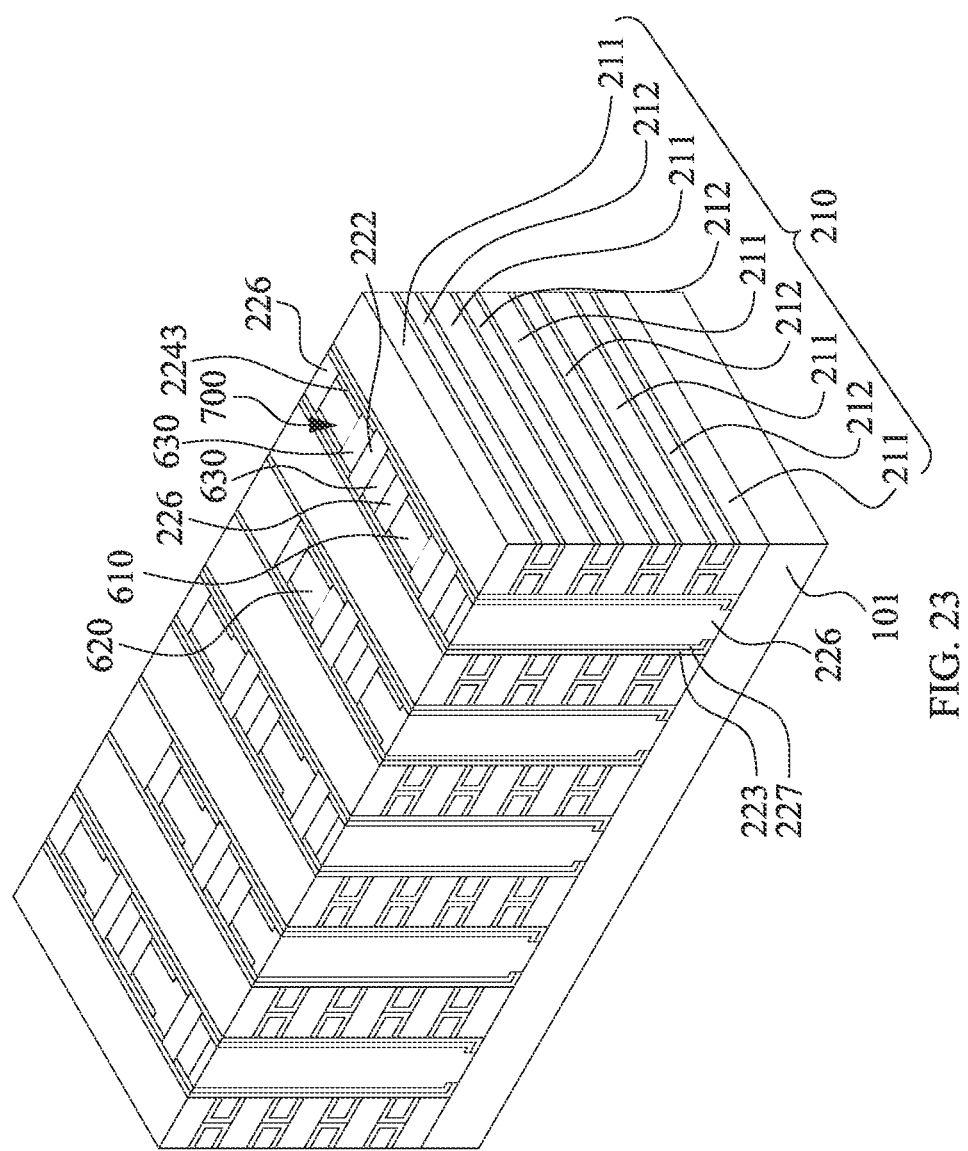

Referring to FIG. 22, cell isolation trenches 560 can be formed in the third sacrificial materials 630 by removing some portions of the third sacrificial materials 630 as well as the semiconductor layers 227, so that the third sacrificial materials 630 can be divided into two parts. One part of the third sacrificial materials 630 next to the remaining portion 700 defines the location of a contact portion 2241 of the first conductive structure 224 to be formed, and the other part of the third sacrificial materials 630 next to the channel isolation structure 226 defines the location of a second conductive structure 225 to be formed. The cell isolation trenches 560 can extend downwardly from the top surface of the cell array region 200 to expose the substrate 101, so that one side of each part of the third sacrificial materials 630 and two ferroelectric layers 223 can be exposed from each cell isolation trench 560. Referring to FIG. 23, the cell isolation trenches 560 can be filled with isolation material, such as an isolation oxide (e.g., $SiO_2$) or other suitable materials, to form cell isolation structure 222.

Figure 24:
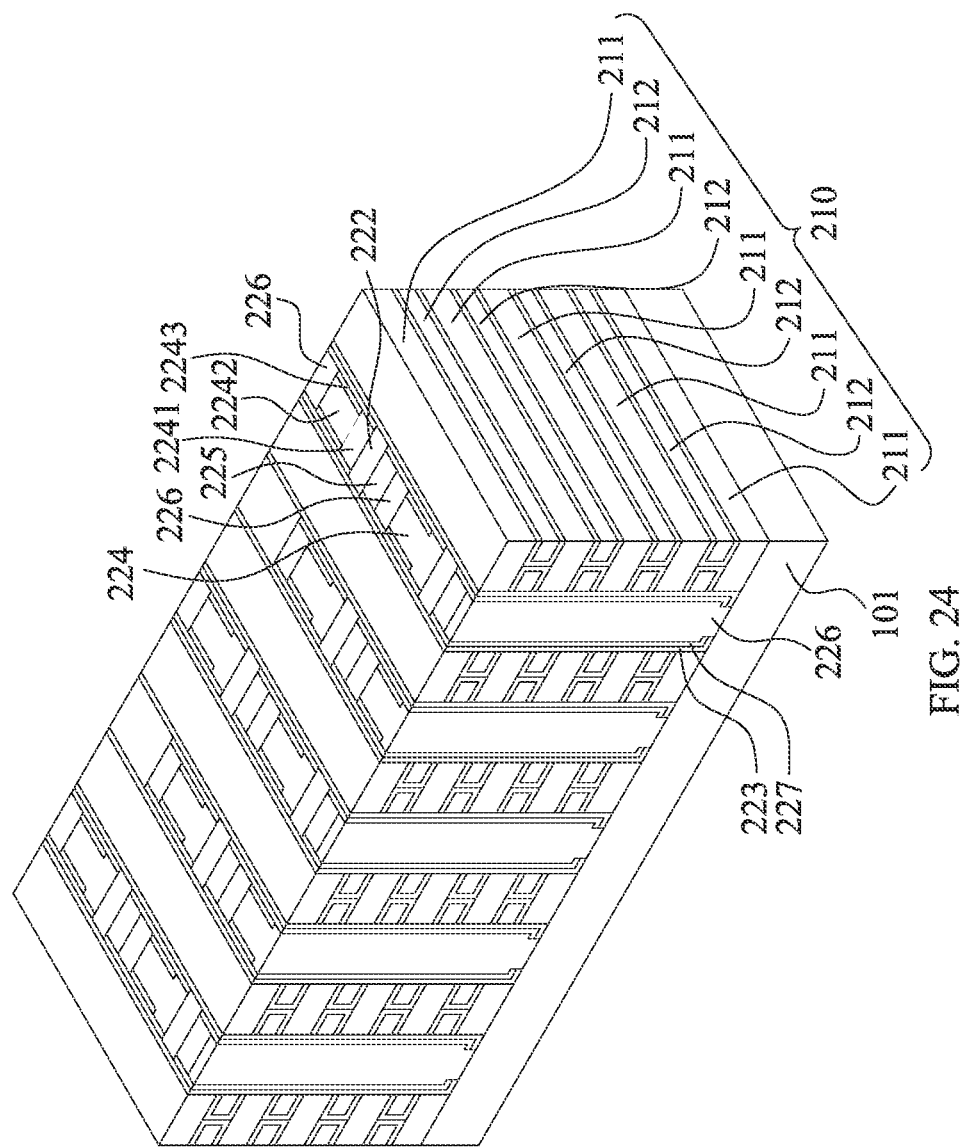

At operation 407, with reference to FIG. 24, the first and second sacrificial materials 610 and 620 in the remaining portion 700 and the third sacrificial materials 630 can be replaced with conductive materials to form first conductive structures 224 and second conductive structures 225. The first and second sacrificial materials 610 and 620 in the remaining portions 700 can be replaced with conductive materials to form an extension portion 2242 of the first conductive structures 224. One part of the third sacrificial materials 630 next to the remaining portion 700 can be replaced with conductive materials to form a contact portion 2241 of the first conductive structures 224. Hence, the contact portion 2241 of the first conductive structure 224 is disposed between two semiconductor layers 227 and the extension portion of the first conductive structures 224 is disposed between two dielectric layers 2243, so that the first conductive structures 224 partially contact the semiconductor layer 227 and partially contact the dielectric layer 2243. From the top view, the contact portion 2241 and the extension portion 2242 may present a T-shape. The other part of the third sacrificial materials 630 next to the channel isolation structure 226 can be replaced with conductive materials to form the second conductive structure 225. Materials for dielectric layers 2243 may have different etching selectivity to the sacrificial materials 610, 620 and 630, so that when the sacrificial materials 610, 620 and 630 are removed by etching procedure, the dielectric layers 2243 can be less impacted or consumed.

In some embodiments, a semiconductor memory structure comprises a plurality of stacking portions of alternating insulating layers and first conductive layers stacking on a substrate along a first direction; and a plurality of cell regions, which are alternately arranged with the plurality of stacking portions along a second direction different from the first direction, each cell region comprising two ferroelectric layers formed along the adjacent stacking portions, and at least one central portion disposed between the ferroelectric layers and comprising a first conductive structure, a second conductive structure, a channel isolation structure separating the first conductive structure from the second conductive structure from each other, and two semiconductor layers formed along the ferroelectric layers; wherein the first conductive structure comprises a contact portion disposed between the semiconductor layers; and an extension portion extending from the contact portion to the channel isolation structure and being separated from the semiconductor layers through dielectric layers.

In some embodiments, a semiconductor memory structure comprises a plurality of cell regions, which are alternately arranged with the plurality of stacking portions, each cell region comprising two ferroelectric layers formed along the adjacent stacking portions, and at least one central portion disposed between the ferroelectric layers and comprising a first conductive structure, a second conductive structure, a channel isolation structure separating the first conductive structure from the second conductive structure, and two semiconductor layers formed along the ferroelectric layers; wherein the first conductive structure partially contacts the semiconductor layer and partially contacts the dielectric layer; and wherein the first conductive structure has a contact area contacting the semiconductor layer, the second conductive structure has a contact area contacting the semiconductor layer, and the contact area of the contact portion of the first conductive structure and the contact area of the second conductive structure are similar.

In some embodiments, a method of manufacturing a semiconductor memory structure comprises forming a stack of alternating insulating layers and first sacrificial layers over a substrate; forming a plurality of trenches in the stack; replacing the first sacrificial layers with first conductive layers through the trenches; filling each trench with a multi-layered structure including a ferroelectric layer, a semiconductor layer, and a dielectric layer; removing portions of the multi-layered structure to leave remaining portions, wherein the remaining portion includes the dielectric layer; forming cell isolation structures between the ferroelectric layers and forming channel isolation structures between the semiconductor layers; and forming first conductive structures and second conductive structures, wherein each first conductive structure is disposed between a cell isolation structure and a channel isolation structure and each second conductive structure is disposed between the cell isolation structure and another channel isolation structure; wherein the first conductive structures partially contact the semiconductor layer and partially contact the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor memory structure, comprising:
a plurality of stacking portions of alternating insulating layers and first conductive layers stacking on a substrate along a first direction; and
a plurality of cell regions, which are alternately arranged with the plurality of stacking portions along a second direction different from the first direction, each cell region comprising:
two ferroelectric layers formed along adjacent stacking portions of the plurality of stacking portions; and
at least one central portion disposed between the two ferroelectric layers and comprising:
a first conductive structure;
a second conductive structure;
a channel isolation structure separating the first conductive structure from the second conductive structure; and
two semiconductor layers formed along the two ferroelectric layers,
wherein the first conductive structure comprises a contact portion disposed between the two semiconductor layers; and an extension portion extending from the contact portion to the channel isolation structure and being separated from the two semiconductor layers through dielectric layers.

2. The semiconductor memory structure of claim 1, wherein the channel isolation structure has a length equal to or less than a length of the extension portion.

3. The semiconductor memory structure of claim 1, wherein the contact portion of the first conductive structure has a contact area contacting the two semiconductor layers, the second conductive structure has a contact area contacting the two semiconductor layers, and the contact area of the contact portion of the first conductive structure and the contact area of the second conductive structure are similar.

4. The semiconductor memory structure of claim 1, wherein the extension portion has a length from the contact portion to the channel isolation structure, which is 10% to 90% of a length of each of the two semiconductor layers.

5. The semiconductor memory structure of claim 1, further comprising a plurality of cell isolation structures separating the central portions from each other.

6. The semiconductor memory structure of claim 1, wherein the contact portion and the extension portion present a T-shape top view.

7. The semiconductor memory structure of claim 1, wherein each first conductive layer in one stacking portion of the plurality of stacking portions is divided into two sublayers through glue layers; and the glue layers are disposed between the first conductive layer and adjacent insulating layers of the insulating layers.

8. A semiconductor memory structure, comprising:
a plurality of cell regions, which are alternately arranged with a plurality of stacking portions, each cell region comprising:
two ferroelectric layers formed along adjacent stacking portions of the plurality of stacking portions; and
at least one central portion disposed between the two ferroelectric layers and comprising:
a first conductive structure;
a second conductive structure;
a channel isolation structure separating the first conductive structure and the second conductive structure from each other; and
two semiconductor layers formed along the two ferroelectric layers,
wherein the first conductive structure partially contacts the two semiconductor layers and is partially separated from the two semiconductor layers through dielectric layers, and
wherein the first conductive structure has a contact area contacting the two semiconductor layers, the second conductive structure has a contact area contacting the two semiconductor layers, and the contact area of the first conductive structure and the contact area of the second conductive structure are similar.

9. The semiconductor memory structure of claim 8, wherein the dielectric layer includes silicon oxide or silicon dioxide ($SiO_2$), silicon oxynitride (SiON), silicon nitride (SiN), silicon carbide, carbon-containing silicon oxide, silicon oxycarbide ($SiO_xC_y$), a high-k dielectric material, or combinations thereof.

10. The semiconductor memory structure of claim 8, wherein the first conductive structure comprises a contact portion disposed between the two semiconductor layers; and an extension portion extending from the contact portion to the channel isolation structure and being separated from the two semiconductor layers through the dielectric layers, so that the first conductive structure partially contacts the two semiconductor layers and partially contacts the dielectric layers.

11. The semiconductor memory structure of claim 10, wherein the extension portion has a length from the contact portion to the channel isolation structure, which is 10% to 90% of a length of each of the two semiconductor layers.

12. The semiconductor memory structure of claim 8, wherein the channel isolation structure has a length equal to or less than a length of the extension portion.

13. The semiconductor memory structure of claim 8, wherein each ferroelectric layer has an L-shaped vertical cross section.

14. The semiconductor memory structure of claim 8, wherein each of the two semiconductor layers has an L-shaped vertical cross section.

15. A semiconductor memory structure, comprising:
a plurality of stacking portions of alternating insulating layers and first conductive layers stacking on a substrate along a first direction; and
a plurality of cell regions, which are alternately arranged with the plurality of stacking portions along a second direction different from the first direction, each cell region comprising:
two ferroelectric layers formed along adjacent stacking portions of the plurality of stacking portions;
at least one central portion disposed between the two ferroelectric layers and comprising:
a first conductive structure;
a second conductive structure;
a channel isolation structure separating the first conductive structure and the second conductive structure from each other; and
two semiconductor layers formed along the two ferroelectric layers; and
a plurality of cell isolation structures, wherein each first conductive structure is disposed between the channel isolation structure and one of the plurality of cell isolation structures,
wherein the first conductive structure partially contacts the two semiconductor layers and is partially separated from the two semiconductor layers through dielectric layers.

16. The semiconductor memory structure of claim 15, wherein the first conductive structure comprises a contact portion disposed between the two semiconductor layers; and an extension portion extending from the contact portion to the channel isolation structure and being separated from the two semiconductor layers through the dielectric layers.

17. The semiconductor memory structure of claim 16, wherein the channel isolation structure has a length equal to or less than a length of the extension portion; and the extension portion has a length from the contact portion to the channel isolation structure, which is 10% to 90% of a length of each of the two semiconductor layers.

18. The semiconductor memory structure of claim 15, wherein each first conductive layer in one stacking portion of the plurality of stacking portions is divided into two sublayers through glue layers; and the glue layers are disposed between the first conductive layer and adjacent insulating layers of the insulating layers.

19. The semiconductor memory structure of claim 18, wherein the glue layers include oxides.

20. The semiconductor memory structure of claim 18, wherein each glue layer has a U shape.

* * * * *